US011791537B2

(12) United States Patent
Ariumi

(10) Patent No.: US 11,791,537 B2
(45) Date of Patent: Oct. 17, 2023

(54) MODULE COMPONENT, ANTENNA MODULE, AND COMMUNICATION DEVICE

(71) Applicant: Murata Manufacturing Co., Ltd., Nagaokakyo (JP)

(72) Inventor: Saneaki Ariumi, Nagaokakyo (JP)

(73) Assignee: MURATA MANUFACTURING CO., LTD., Nagaokakyo (JP)

(*) Notice: Subject to any disclaimer, the term of this patent is extended or adjusted under 35 U.S.C. 154(b) by 113 days.

(21) Appl. No.: 17/496,811

(22) Filed: Oct. 8, 2021

(65) Prior Publication Data

US 2022/0029273 A1 Jan. 27, 2022

Related U.S. Application Data

(63) Continuation of application No. PCT/JP2020/017180, filed on Apr. 21, 2020.

(30) Foreign Application Priority Data

Apr. 26, 2019 (JP) .................................. 2019-086633

(51) Int. Cl.
*H05K 1/18* (2006.01)
*H01Q 1/22* (2006.01)
(Continued)

(52) U.S. Cl.
CPC ........... *H01Q 1/2283* (2013.01); *H01L 23/66* (2013.01); *H05K 1/181* (2013.01);
(Continued)

(58) Field of Classification Search
CPC .... H05K 1/11; H05K 1/14; H05K 1/144–147; H05K 1/18;
(Continued)

(56) References Cited

U.S. PATENT DOCUMENTS 6,765,805 B2 * 7/2004 Naruse ...................... H01P 1/00
361/803
8,208,270 B2 * 6/2012 Mori ...................... H05K 3/368
361/795
(Continued)

FOREIGN PATENT DOCUMENTS

JP 2006-190767 A 7/2006
JP 5773082 B2 9/2015
(Continued)

OTHER PUBLICATIONS

International Search Report and Written Opinion dated Jul. 21, 2020, received for PCT Application PCT/JP2020/017180, Filed on Apr. 21, 2020, 8 pages including English Translation.

*Primary Examiner* — Tuan T Dinh
(74) *Attorney, Agent, or Firm* — XSENSUS LLP

(57) ABSTRACT

A module component includes a substrate having a first principal surface, a semiconductor substrate disposed on the first principal surface of the substrate, multiple terminals, and a resin layer. The terminals include multiple reference-potential terminals, which are electrically connected to the reference potential, and multiple signal terminals, which are disposed adjacent to at least one of the reference-potential terminals in the direction along an end portion of the substrate and which are supplied with a signal. In a plan view in the direction perpendicular to the first principal surface of the substrate, in at least one of the reference-potential terminals, the support portion is disposed between an end surface of the connection portion and the end portion of the substrate, and, in at least one of the signal terminals, the end surface of the connection portion is disposed between the support portion and the end portion of the substrate.

20 Claims, 18 Drawing Sheets

(51) Int. Cl.
*H01L 23/66* (2006.01)
*H01Q 23/00* (2006.01)

(52) U.S. Cl.
CPC ...... *H01L 2223/6677* (2013.01); *H01Q 23/00* (2013.01); *H05K 2201/10098* (2013.01)

(58) Field of Classification Search
CPC .. H05K 1/181–187; H05K 3/30; H05K 3/284; H05K 3/428; H01L 23/552; H01L 23/562; H01L 23/498; H01L 23/49811; H01L 23/49861; H01L 23/66
USPC ......... 361/770–795, 816, 818; 257/659–690, 257/737, 787–790; 174/520
See application file for complete search history.

(56) References Cited

U.S. PATENT DOCUMENTS

| | | | | |
|---|---|---|---|---|
| 2011/0037170 | A1* | 2/2011 | Shinohara | H01L 21/565 257/737 |
| 2013/0223038 | A1* | 8/2013 | Yamamoto | H05K 3/30 29/841 |
| 2014/0251670 | A1* | 9/2014 | Sakai | H05K 3/4015 29/832 |
| 2015/0179621 | A1* | 6/2015 | Matsumoto | H01L 24/17 257/737 |

FOREIGN PATENT DOCUMENTS

| | | |
|---|---|---|
| WO | 2007/132612 A1 | 11/2007 |
| WO | 2018/168653 A1 | 9/2018 |

\* cited by examiner

MODULE COMPONENT, ANTENNA MODULE, AND COMMUNICATION DEVICE

CROSS-REFERENCE TO RELATED APPLICATIONS

The present application is a continuation of and claims priority to PCT/JP2020/017180, filed Apr. 21, 2020, which claims priority to JP 2019-086633, filed Apr. 26, 2019, the entire contents of each are incorporated herein by its reference.

TECHNICAL FIELD

The present disclosure relates to a module component, an antenna module, and a communication device.

BACKGROUND ART

Patent Document 1 set forth below describes a module including a wiring substrate, multiple columnar terminals and a semiconductor substrate, which are disposed on one of the principal surfaces of the wiring substrate, and multiple components, which are disposed on the other principal surface of the wiring substrate. The terminals are electrically connected to mounting electrodes of a mother board. Thus, the module is mounted on the mounting surface of the mother board.

CITATION LIST

Patent Literature

Patent Document 1: Japanese Patent No. 5773082

SUMMARY

Technical Problem

Increasing the area of contact parts, in which terminals are in contact with a mother board, of the terminals causes stable joint strength to be obtained in mounting the module on the mother board. In contrast, increasing the diameters of columnar terminals may cause a decrease of the impedance of the terminals, resulting in degradation of the characteristics of the module.

An object of the present disclosure is to provide a module component, an antenna module, and a communication device which may suppress degradation of electrical characteristics while a high joint strength of terminals is obtained.

Solution to Problem

A module component according to an aspect of the present disclosure includes a substrate, a semiconductor substrate, multiple terminals, and a resin layer. The substrate has a first principal surface. The semiconductor substrate is disposed on the first principal surface of the substrate. Each of the terminals includes a support portion and a connection portion. The support portion has a first surface and a second surface. The first surface extends in the direction perpendicular to the first principal surface. The second surface is opposite the first surface. The support portion is connected to the first principal surface on a first end of the support portion. The connection portion is disposed as an integral unit with the first surface on a second end of the support portion, and extends in the direction perpendicular to the first surface. The resin layer covers at least a side surface of the semiconductor substrate, and covers the support portion and an end surface of the connection portion. The end surface is present in the extending direction of the connection portion. The terminals include multiple reference-potential terminals and multiple signal terminals. The reference-potential terminals are connected to a reference potential electrically. The signal terminals are disposed adjacent to at least one of the reference-potential terminals in the direction along an end portion of the substrate, and are supplied with a signal. In a plan view in the direction perpendicular to the first principal surface of the substrate, in at least one of the reference-potential terminals, the support portion is disposed between the end surface of the connection portion and the end portion of the substrate. In the plan view, in at least one of the signal terminals, the end surface of the connection portion is disposed between the support portion and the end portion of the substrate.

An antenna module according to an aspect of the present disclosure includes the module component described above, multiple antenna devices that are disposed in the substrate, and an RFIC that is disposed on the first principal surface of the substrate.

A communication device according to an aspect of the present disclosure includes the antenna module described above, and a baseband IC that supplies a baseband signal to the antenna module.

Advantageous Effects

The present disclosure may cause degradation of electrical characteristics to be suppressed while a high joint strength of terminals is obtained.

DESCRIPTION OF EMBODIMENTS

A module component, an antenna module, and a communication device according to embodiments of the present disclosure will be described in detail below on the basis of the drawings. The present disclosure is not limited to the embodiments. The embodiments are exemplary. Needless to say, partial replacement or combination of configurations illustrated in different embodiments may be made. In a second embodiment and its subsequent embodiments, points common to those in a first embodiment will be omitted. Only different points will be described. In particular, substantially the same operational effects caused by substantially the same configurations will not be described in following embodiments.

First Embodiment

Figure 1:
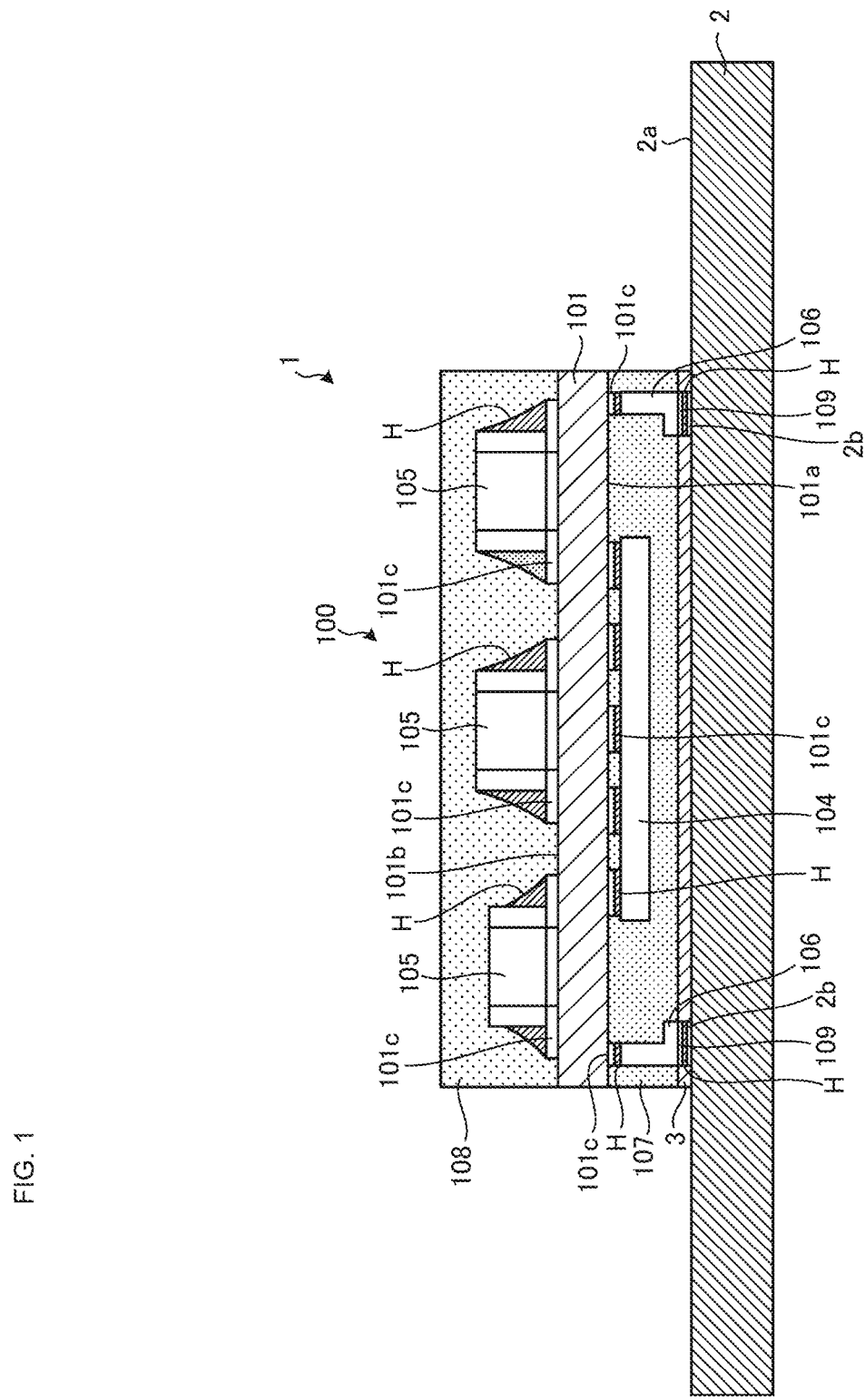
FIG. 1 is a diagram illustrating a module mounted device including a module component according to a first embodiment.

FIG. 1 is a diagram illustrating a module mounted device including a module component according to a first embodiment. A module mounted device 1 is installed, for example, in a portable terminal, such as a cellular phone, a smartphone, or a tablet terminal, or a personal computer having a communication function.

As illustrated in FIG. 1, the module mounted device 1 includes a mother board 2, a module component 100, and an underfill resin layer 3. The module component 100 is mounted on a mounting surface 2a of the mother board 2. The underfill resin layer 3 is disposed to protect the connecting part between the mother board 2 and the module component 100.

More specifically, the mother board 2 includes mounting electrodes 2b (including reference-potential electrodes 2bG for grounding and signal electrodes 2bS for supplying signals (see FIG. 5)) and a wiring pattern connected to the mounting electrodes 2b. The wiring pattern is connected to the mounting electrodes 2b, which are formed on the mounting surface 2a of the mother board 2, by using via conductors (not illustrated). The mother board 2 is formed from a commonly used material for forming substrates, such as a resin material, for example, glass epoxy resin or liquid crystal polymer, or a ceramic material. The wiring pattern and the via conductors are formed from a conductive material, such as silver (Ag), copper (Cu), or gold (Au). Through connection with the wiring pattern, for example, using via conductors, various electric circuits may be formed in the mother board 2.

The module component 100 includes a substrate 101, a semiconductor substrate 104, multiple chip components 105, multiple terminals 106, a first resin layer 107, and a second resin layer 108. The substrate 101 has a first principal surface 101a and a second principal surface 101b. Multiple mounting electrodes 101c for mounting components and the like are provided on the first principal surface 101a and the second principal surface 101b. The substrate 101 includes a wiring pattern and via conductors for electrically connecting the components and the multiple terminals 106. The wiring pattern and the via conductors are formed from a conductive material, such as Ag, Cu, or Au.

As the substrate 101, for example, a ceramic multilayer substrate is used. As a ceramic multilayer substrate, for example, an LTCC (Low Temperature Co-fired Ceramics) multilayer substrate is used. The substrate 101 may be a multilayer resin substrate formed by laminating multiple resin layers formed from resin, such as epoxy or polyimide. The substrate 101 may be one of the following substrates: a multilayer resin substrate formed by laminating multiple resin layers formed from liquid crystal polymer (Liquid Crystal Polymer: LCP) having a low permittivity; a multilayer resin substrate formed by laminating multiple resin layers formed of fluororesin; and a ceramic multilayer substrate obtained through sintering at a temperature higher than that for LTCC.

The semiconductor substrate 104, the terminals 106, and the resin layers (the first resin layer 107 and the underfill resin layer 3) are disposed on the first principal surface 101a of the substrate 101. The semiconductor substrate 104 and the terminals 106 are connected to mounting electrodes 101c, which are disposed on the first principal surface 101a, by using solders H. The semiconductor substrate 104 forms a system IC, which processes RF signals and baseband signals, by forming given electric circuits on the surface facing the first principal surface 101a of the substrate 101. The semiconductor substrate 104 has a bare chip structure or a wafer level chip size package (WL-CSP) structure cut out from a semiconductor wafer of Si or the like. The semiconductor substrate 104 is mounted face-down on the first principal surface 101a of the substrate 101.

Metal films 109 are disposed on the back surfaces of the terminals 106 correspondingly. The metal films 109 are connected to the respective mounting electrodes 2b, which are disposed on the mother board 2, by using solders H. Thus, the module component 100 is mounted on the mounting surface 2a of the mother board 2. The detailed configuration of the terminals 106 will be described below.

The first resin layer 107 covers at least the side surfaces and the back surface of the semiconductor substrate 104, and also covers the side surfaces of the terminals 106. The underfill resin layer 3 is formed by filling the space between the module component 100, which is mounted on the mounting surface 2a of the mother board 2, and the mother board 2, for example, with epoxy resin.

The chip components 105 are connected to mounting electrodes 101c, which are disposed on the second principal surface 101b, by using solders H. The chip components 105 include a chip capacitor, a chip inductor, a chip resistor, and an IC (Integrated Circuit). The second resin layer 108 covers the chip components 105 and is disposed on the second principal surface 101b. The second resin layer 108 is resin for molding, such as epoxy resin.

Figure 2:
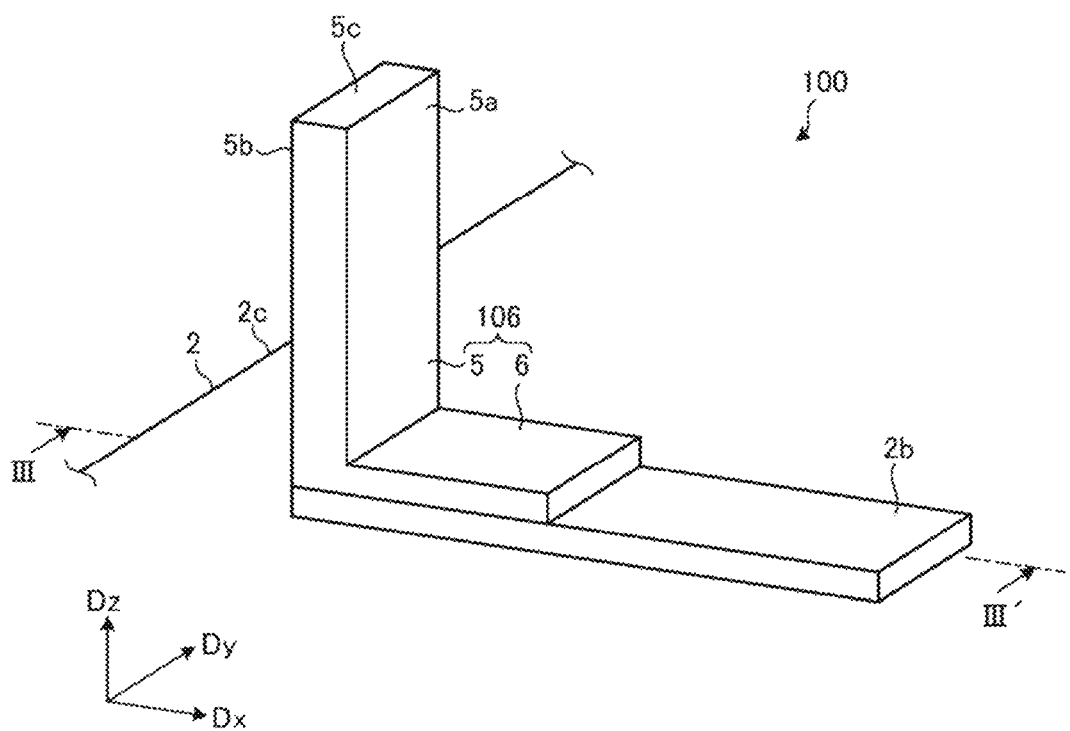
FIG. 2 is a perspective view of a terminal according to the first embodiment.
Figure 3:
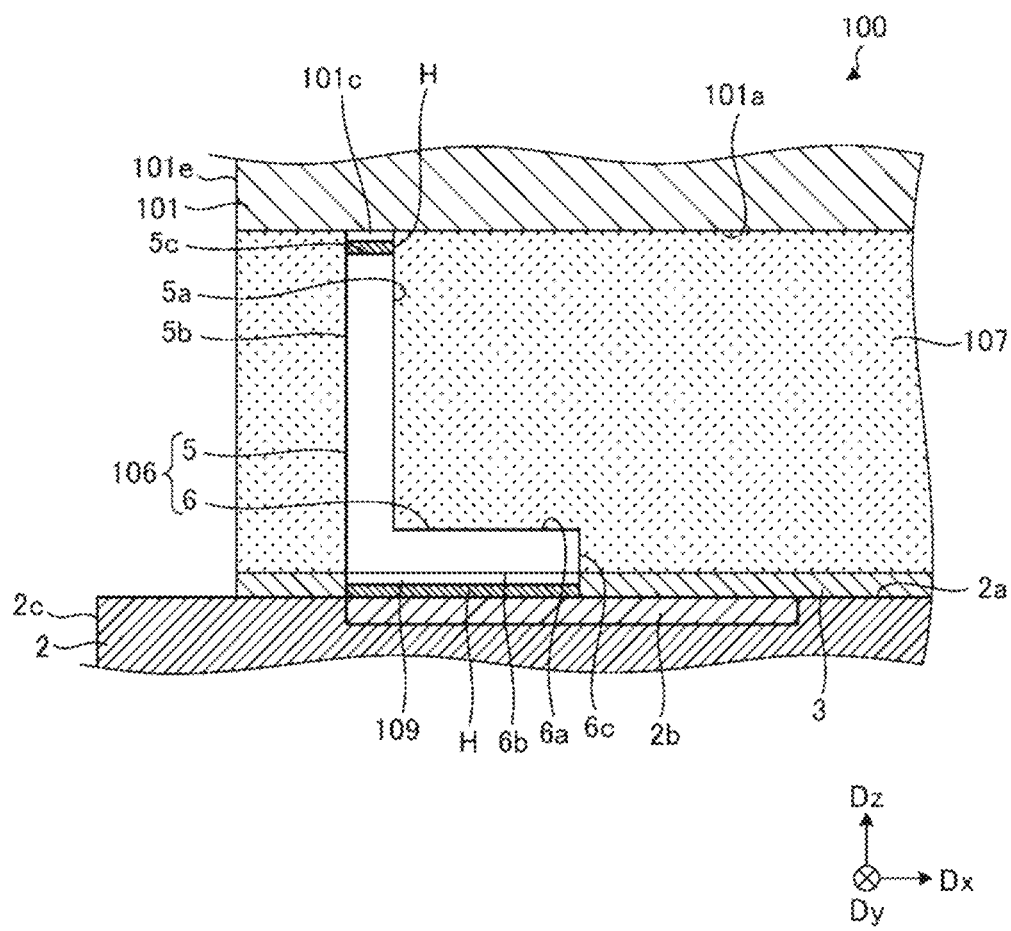
FIG. 3 is a cross-sectional view along III-III' in FIG. 2.
Figure 4:
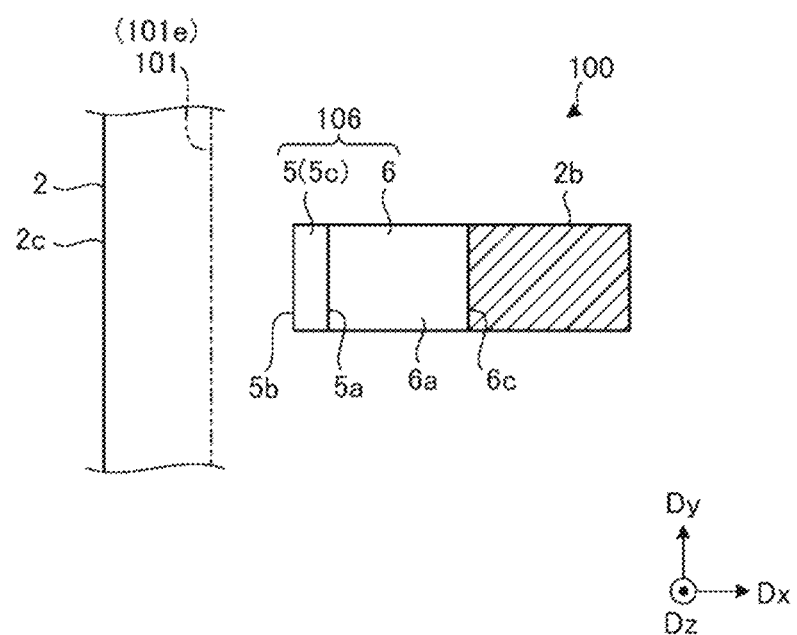
FIG. 4 is a plan view of a terminal according to the first embodiment.

The detailed configuration of each terminal 106 will be described. FIG. 2 is a perspective view of a terminal according to the first embodiment. FIG. 3 is a cross-sectional view along III-III' in FIG. 2. FIG. 4 is a plan view of a terminal according to the first embodiment. FIG. 2 is a schematic illustration with omission of upper components of the terminal 106, such as the substrate 101. To make FIG. 4 easier to view, the substrate 101 is illustrated by using a long dashed double-short dashed line in FIG. 4. FIGS. 2 to 4 illustrate a single terminal 106. Actually, terminals 106 are arrayed along an end portion 101e of the substrate 101.

As illustrated in FIGS. 2 and 3, the terminal 106 includes a support portion 5 and a connection portion 6. The support portion 5 is a plate-like member having a first surface 5a and a second surface 5b that is the opposite side of the first surface 5a. The support portion 5 extends in third direction Dz, and has an upper surface 5c on a first end side which is connected to the first principal surface 101a of the substrate 101.

First direction Dx and second direction Dy are directions parallel to the first principal surface 101a of the substrate 101. For example, first direction Dx is a direction perpendicular to the end portion 101e of the substrate 101. Second direction Dy is orthogonal to first direction Dx, and is a direction along the end portion 101e of the substrate 101. Third direction Dz is a direction orthogonal to first direction Dx and second direction Dy. That is, third direction Dz is a direction perpendicular to the first principal surface 101a of the substrate 101.

The first surface 5a and the second surface 5b of the support portion 5 extend in third direction Dz, and are disposed parallel to the extending direction of the end portion 101e of the substrate 101 (or the extending direction of an end portion 2c of the mother board 2). In first direction Dx, the second surface 5b of the support portion 5 is disposed closer to the end portion 101e of the substrate 101 than the first surface 5a.

The connection portion 6 is a plate-like member having an upper surface 6a and a lower surface 6b. The connection portion 6 is disposed as an integral unit with the first surface 5a on a second end side of the support portion 5, and extends in the direction perpendicular to the first surface 5a. The lower surface 6b of the connection portion 6 is connected to the mounting electrode 2b of the mother board 2. The upper surface 6a and the lower surface 6b of the connection portion 6 are disposed parallel to the first principal surface 101a of the substrate 101. In first direction Dx, the connection portion 6 is disposed farther from the end portion 101e of the substrate 101 than the second surface 5b of the support portion 5. However, the orientation of the terminal 106 relative to the end portion 101e of the substrate 101, that is, the positional relationship between the support portion 5 and the connection portion 6, may be reversed.

The thickness of the support portion 5 (the width in first direction Dx) is substantially equal to the thickness of the connection portion 6 (the width in third direction Dz). The support portion 5 and the connection portion 6 of the terminal 106 may be formed as an integral unit through press working, bending, or the like, for example, by using a single plate-like member formed of a conductive material, such as Ag, Cu, or Au. However, the method of forming a terminal 106 is not limited to this. For example, the support portion 5 and the connection portion 6 may be formed as separate members.

As illustrated in FIG. 3, the terminal 106 is covered by the first resin layer 107. The first resin layer 107 covers the first surface 5a and the second surface 5b of the support portion 5 and the upper surface 6a and an end surface 6c of the connection portion 6. The end surface 6c is a surface between the upper surface 6a and the lower surface 6b, and is disposed parallel to third direction Dz. The underfill resin layer 3 is disposed between the mounting surface 2a of the mother board 2 and the first resin layer 107. The height position of the upper surface of the underfill resin layer 3 matches the height position of the lower surface 6b of the connection portion 6.

Arrangement of the first resin layer 107 and the underfill resin layer 3 enables the semiconductor substrate 104 and the terminals 106 to be protected, and enables the joint strength between the terminals 106 and the substrate 101 to be increased.

As illustrated in FIG. 4, in a plan view, both the support portion 5 and the connection portion 6 are rectangular in shape. The plan view indicates the arrangement relationship viewed in third direction Dz. The width of the support portion 5 in second direction Dy is longer than the width (thickness) in first direction Dx. The width of the connection portion 6 in second direction Dy is equal to the width of the support portion 5 in second direction Dy. The connection portion 6 extends in first direction Dx with a constant width. That is, the width, in second direction Dy, of the connecting part, which is integral with the support portion 5, of the connection portion 6 is equal to the width of the end surface 6c in second direction Dy. The width of the connection portion 6 in first direction Dx is longer than the width of the support portion 5 in first direction Dx. That is, the area of the lower surface 6b of the connection portion 6 is larger than the sectional area of the support portion 5. In the present embodiment, the width of the connection portion 6 in first direction Dx is the length from the first surface 5a of the support portion 5 to the end surface 6c of the connection portion 6.

The shapes and sizes of the support portion 5 and the connection portion 6 of the terminal 106 are merely exemplary, and may be changed appropriately. For example, the width of the connection portion 6 in second direction Dy may be different from the width of the support portion 5 in second direction Dy. In addition, the width (thickness) of the connection portion 6 in third direction Dz may be different from the width (thickness) of the support portion 5 in first direction Dx. The connecting part between the support portion 5 and the connection portion 6, which bends in cross section, is not limiting. The support portion 5 may connect with the connection portion 6 in a curvature shape.

As described above, the module component 100 according to the present embodiment includes the substrate 101 having the first principal surface 101a, the semiconductor substrate 104 disposed on the first principal surface 101a of the substrate 101, the terminals 106, and the resin layer (the first resin layer 107). The terminals 106 each have the support portion 5 and the connection portion 6. Each support portion 5 has the first surface 5a, which extends in the direction perpendicular to the first principal surface 101a, and the second surface 5b, which is opposite the first surface 5a. Each support portion 5 is connected to the first principal surface 101a on the first end side. Each connection portion 6 is disposed as an integral unit with the first surface 5a, on the second end side, of the corresponding support portion 5, and extends in the direction perpendicular to the first surface 5a. The resin layers cover at least the side surfaces of the semiconductor substrate 104, and covers the support portions 5 and the end surfaces 6c which are present in the extending direction of the connection portions 6.

Thus, since the area of the lower surfaces 6b of the connection portions 6 is sufficiently larger than the sectional area of the support portions 5, a high joint strength between the terminals 106 and the mounting electrodes 2b of the mother board 2 may be obtained. Compared with the case in which pillar terminals each having a sectional area equal to the area of the lower surface 6b of a connection portion 6 are disposed, the terminals 106 may cause suppression of an increase of the sectional area of the support portions 5. Therefore, the module component 100 may cause suppression of a decrease of the impedance of the terminals 106. Consequently, the module component 100 according to the present embodiment enables a decrease in the electrical characteristics to be suppressed while a high joint strength of the terminals 106 is obtained.

Figure 5:
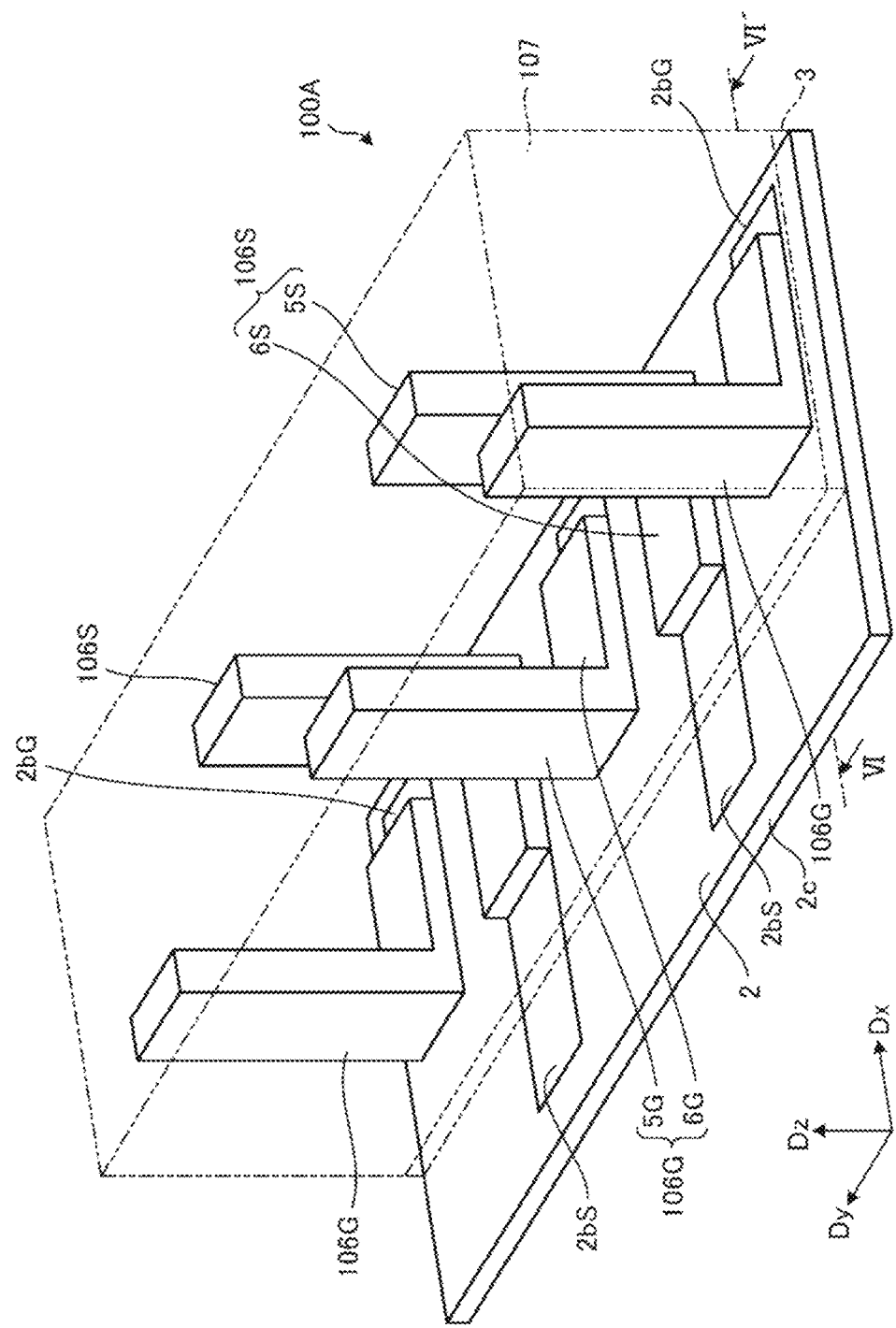
FIG. 5 is a perspective view of multiple reference-potential terminals and multiple signal terminals according to the first embodiment.
Figure 6:
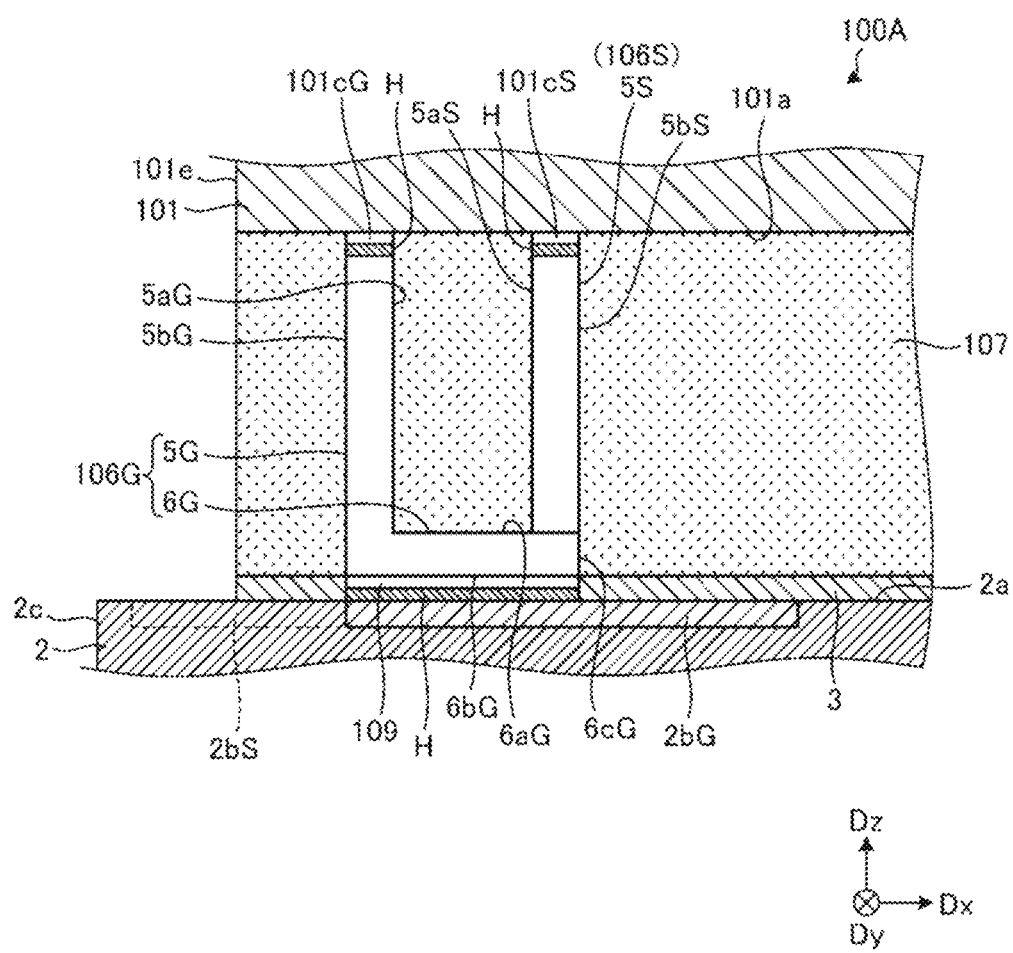
FIG. 6 is a cross-sectional view along VI-VI' in FIG. 5.
Figure 7:
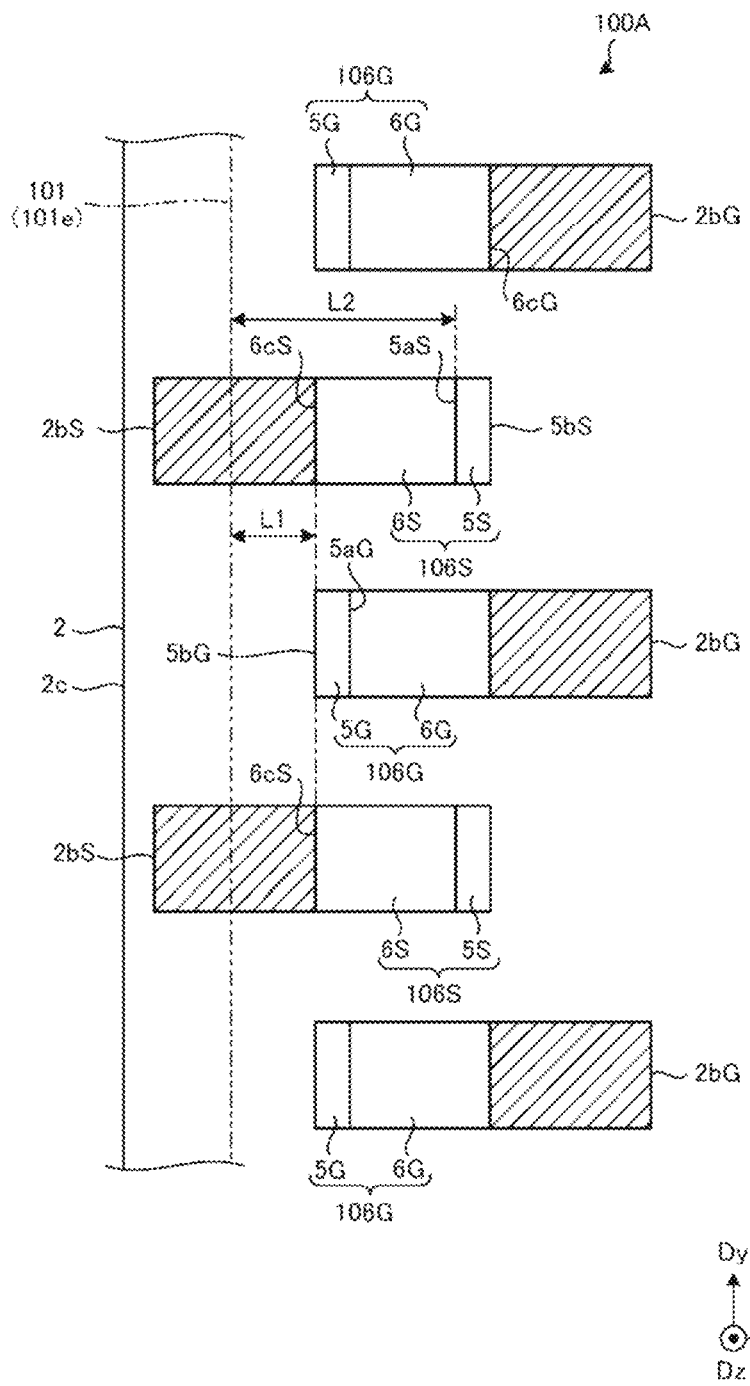
FIG. 7 is a plan view of multiple reference-potential terminals and multiple signal terminals according to the first embodiment.

FIG. 5 is a perspective view of multiple reference-potential terminals and multiple signal terminals according to the first embodiment. FIG. 6 is a cross-sectional view along VI-VI' in FIG. 5. FIG. 7 is a plan view of multiple reference-potential terminals and multiple signal terminals according to the first embodiment. To make FIG. 5 easier to view, the resin layers (the first resin layer 107 and the underfill resin layer 3) are illustrated by using a long dashed double-short dashed line in FIG. 5.

By referring to FIGS. 5 to 7, the configuration in which the terminals 106 include reference-potential terminals 106G and signal terminals 106S will be described below. As illustrated in FIG. 5, the reference-potential terminals 106G and the signal terminals 106S have substantially the same configuration as that of the terminals 106 in the first embodiment. The reference-potential terminals 106G each have a support portion 5G and a connection portion 6G, and the signal terminals 106S each have a support portion 5S and a connection portion 6S. The support portions 5G and 5S and the connection portions 6G and 6S will be described by skipping a description common to the above-described configuration.

The connection portion 6G of each reference-potential terminal 106G is connected to the corresponding reference-potential electrode 2bG in the mother board 2, and is electrically connected to the reference potential. The support portion 5G of each reference-potential terminal 106G is connected to the corresponding one of reference-potential electrodes 101cG (see FIG. 6) of the substrate 101. The reference potential is, for example, the ground potential. However, the reference potential is not limited to the ground potential.

The connection portion 6S of each signal terminal 106S is connected to the corresponding signal electrode 2bS in the mother board 2, and is supplied with signals. The support portion 5S of each signal terminals 106S is connected to the corresponding one of signal electrodes 101cS (see FIG. 6) of the substrate 101. The signals include at least one of the following signals: a signal supplied to the semiconductor substrate 104 and the chip components 105 from the mother substrate 2; a signal which is output from the semiconductor substrate 104 and the chip components 105 to the mother board 2.

As illustrated in FIGS. 6 and 7, the reference-potential terminals 106G and the signal terminals 106S are disposed so that the extending direction of the connection portions 6G is opposite to the extending direction of the connection portions 6S. Specifically, a second surface 5bG of the support portion 5G of each reference-potential terminal 106G is disposed closer to the end portion 101e of the substrate 101 than a first surface 5aG of the support portion 5G. The support portion 5G of each reference-potential terminal 106G is disposed between an end surface 6cG of the connection portion 6G of the reference-potential terminal 106G and the end portion 101e of the substrate 101.

The first surface 5aS of the support portion 5S of each signal terminal 106S is disposed closer to the end portion 101e of the substrate 101 than a second surface 5bS of the support portion 5S. In a plan view, an end surface 6cS of the connection portion 6S of each signal terminal 106S is disposed between the support portion 5S of the signal terminal 106S and the end portion 101e of the substrate 101.

When viewed in second direction Dy, the reference-potential terminals 106G and the signal terminals 106S are disposed so that the position of the support portions 5G of the reference-potential terminals 106G is different from that of the support portions 5S of the signal terminals 106S. The support portions 5S of the signal terminals 106S are disposed farther from the end portion 101e of the substrate 101 than the support portions 5G of the reference-potential terminals 106G.

As illustrated in FIG. 7, in a plan view, distance L1, in first direction Dx, between the second surface 5bG of the support portion 5G of each reference-potential terminal 106G and the end portion 101e of the substrate 101 is equal to distance L1, in first direction Dx, between the end surface 6cS, in the extending direction of the connection portion 6S, of each signal terminal 106S and the end portion 101e and the substrate 101. Distance L1 is shorter than distance L2, in first direction Dx, between the first surface 5aS of the support portion 5S of each signal terminal 106S and the end portion 101e of the substrate 101.

In the configuration described above, the reference-potential terminals 106G may cause the shielding effect against noise from the outside to be enhanced. Therefore, a module component 100A may improve the SN ratio of signals propagating through the signal terminals 106S.

In second direction Dy, each signal terminal 106S is disposed adjacent to a corresponding reference-potential terminal 106G. More specifically, in second direction Dy, the reference-potential terminals 106G are alternately disposed one by one with the signal terminals 106S. That is, each reference-potential terminal 106G is disposed between two corresponding signal terminals 106S arranged in second direction Dy. Thus, signal interference between signal terminals 106S may be suppressed.

Each reference-potential terminal 106G arranged in second direction Dy has the support portion 5G from which the distance to the end portion 101e of the substrate 101 is distance L1. Each signal terminal 106S arranged in second direction Dy has the support portion 5S from which the distance to the end portion 101e of the substrate 101 is distance L2. Therefore, in mounting the reference-potential terminals 106G and the signal terminals 106S on the substrate 101, the stability of the reference-potential terminals 106G and the signal terminals 106S may be enhanced.

First Modified Example

Figure 8:
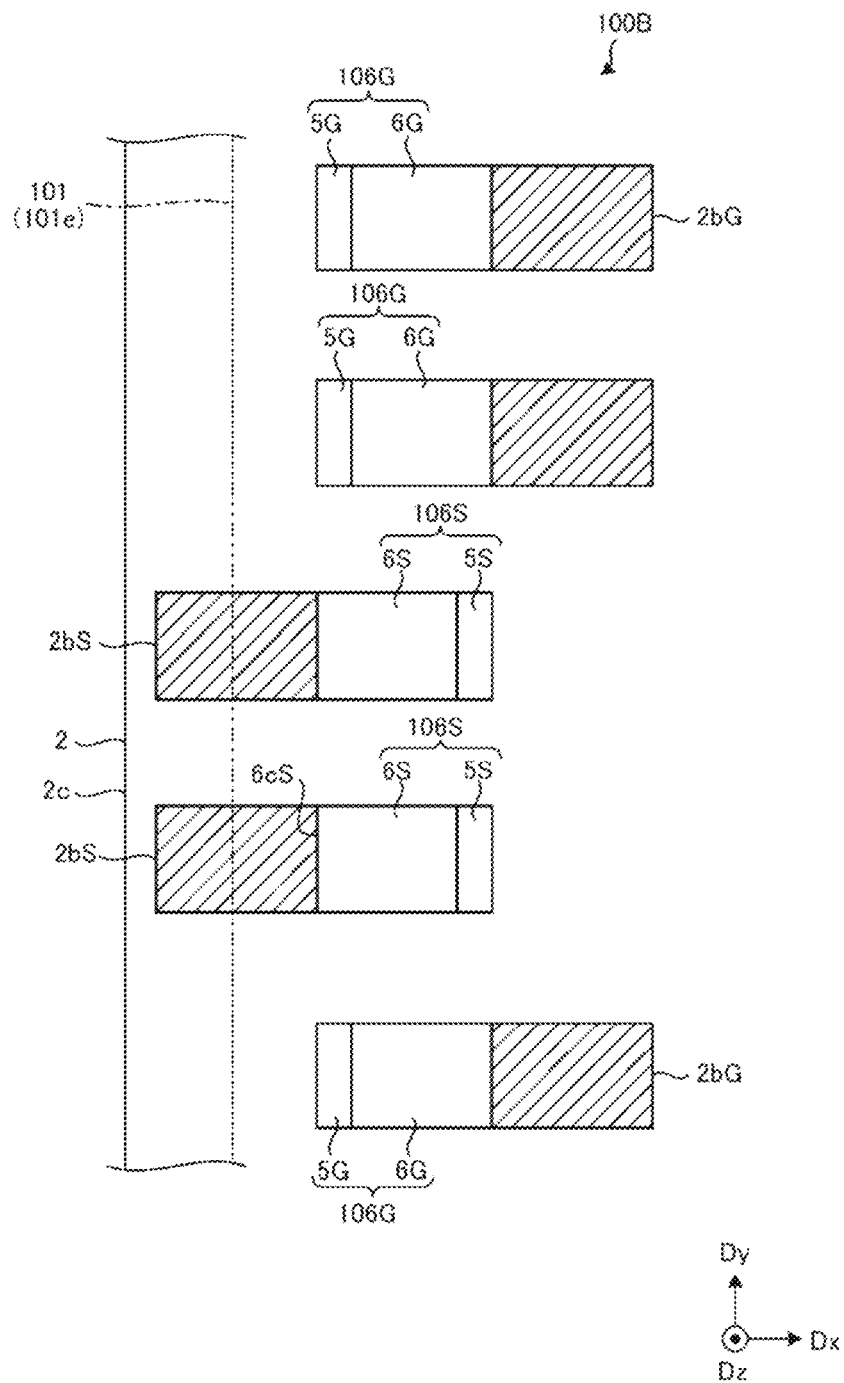
FIG. 8 is a plan view of multiple reference-potential terminals and multiple signal terminals according to a first modified example.

FIG. 8 is a plan view of reference-potential terminals and signal terminals according to a first modified example. In the description below, the same components as those in the embodiment described above are designated with the same reference characters, and will not be described. In the first modified example, the configuration in which, unlike the first embodiment, adjacent reference-potential terminals 106G are alternately disposed with adjacent signal terminals 106S along the end portion 101e of the substrate 101 will be described.

As illustrated in FIG. 8, two reference-potential terminals 106G are disposed adjacent to each other in second direction Dy. Two signal terminals 106S are disposed adjacent to each other in second direction Dy. Two reference-potential terminals 106G are alternately disposed with two signal terminals 106S in second direction Dy. In other words, in second direction Dy, two signal terminals 106S are disposed side by side between two reference-potential terminals 106G.

In a module component 100B according to the first modified example, differential signals, that is, signals whose phases are inverted to each other, are supplied to the signal terminals 106S. In this case, signals having the same phase are supplied to two adjacent signal terminals 106S. Thus, an increase of the parasitic capacitance between wires connected to the two signal terminals 106S may be suppressed.

The example in FIG. 8 is not limiting. Three or more reference-potential terminals 106G may be disposed adjacent to three or more signal terminals 106S in second direction Dy. The number of adjacent reference-potential terminals 106G may be different from that of adjacent signal terminals 106S. For example, in second direction Dy, a single reference-potential terminal 106G may be disposed between two adjacent signal terminals 106S and two adjacent signal terminals 106S.

Second Modified Example

Figure 9:
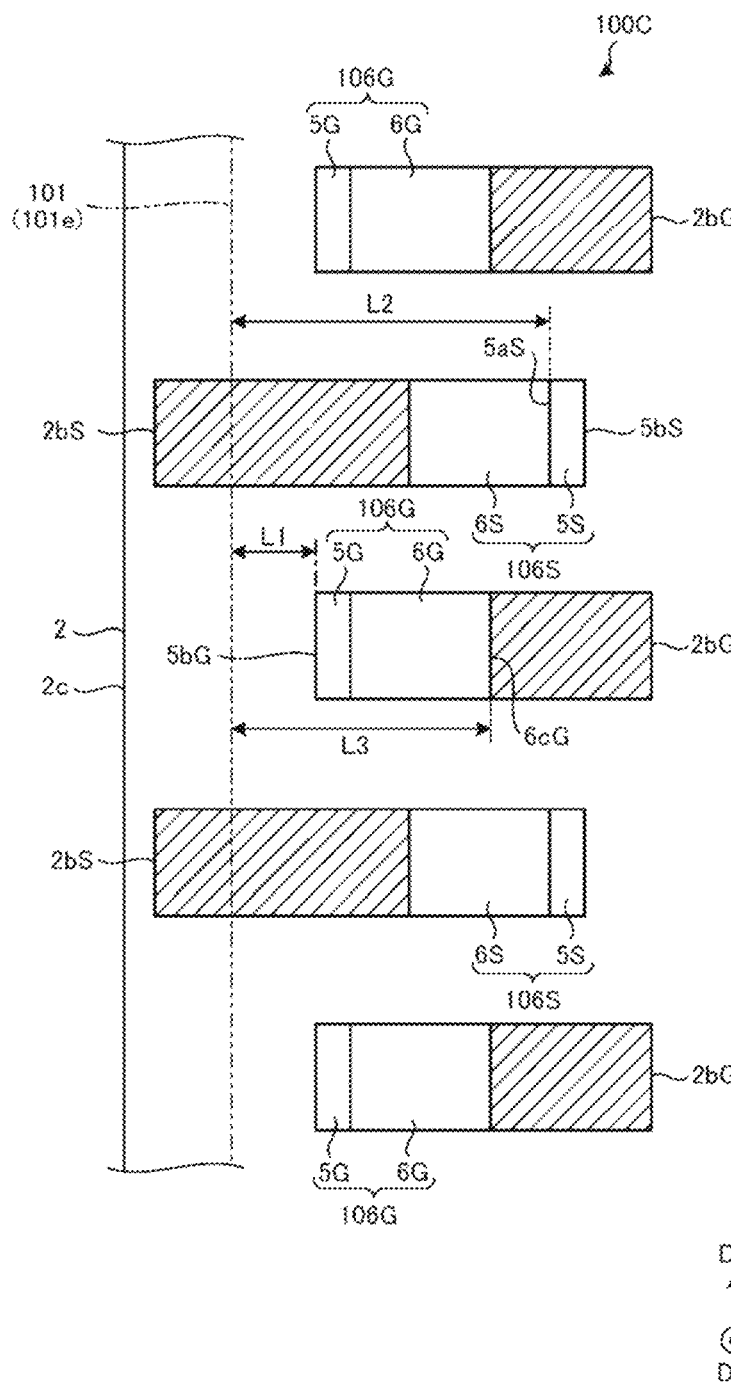
FIG. 9 is a plan view of multiple reference-potential terminals and multiple signal terminals according to a second modified example.

FIG. 9 is a plan view of reference-potential terminals and signal terminals according to a second modified example. In the second modified example, the configuration in which, unlike the first embodiment and the first modified example, the signal terminals 106S are disposed farther from the end portion 101e of the substrate 101 than the reference-potential terminals 106G will be described.

As illustrated in FIG. 9, in a plan view, distance L1, in first direction Dx, between the second surface 5bG of the support portion 5G of each reference-potential terminal 106G and the end portion 101e of the substrate 101 is shorter than distance L2, in first direction Dx, between the first surface 5aS of the support portion 5S of each signal terminal 106S and the end portion 101e of the substrate 101. In addition, distance L3, in first direction Dx, between the end surface 6cG, in the extending direction of the connection portion 6G, of each reference-potential terminal 106G and the end portion 101e of the substrate 101 is shorter than distance L2.

Thus, in a module component 100C according to the second modified example, the reference-potential terminals 106G are disposed closer to the end portion 101e of the substrate 101 than the signal terminals 106S, improving the shielding effect compared with the first embodiment.

The configuration according to the second modified example may be combined with the configuration according to the first modified example.

Third Modified Example

Figure 10:
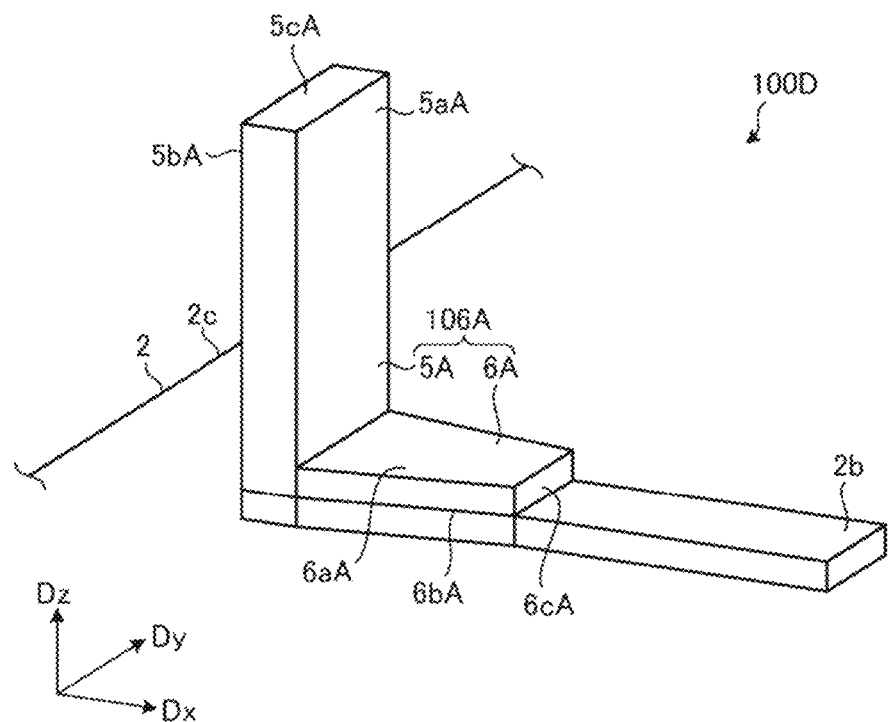
FIG. 10 is a perspective view of a terminal according to a third modified example.
Figure 11:
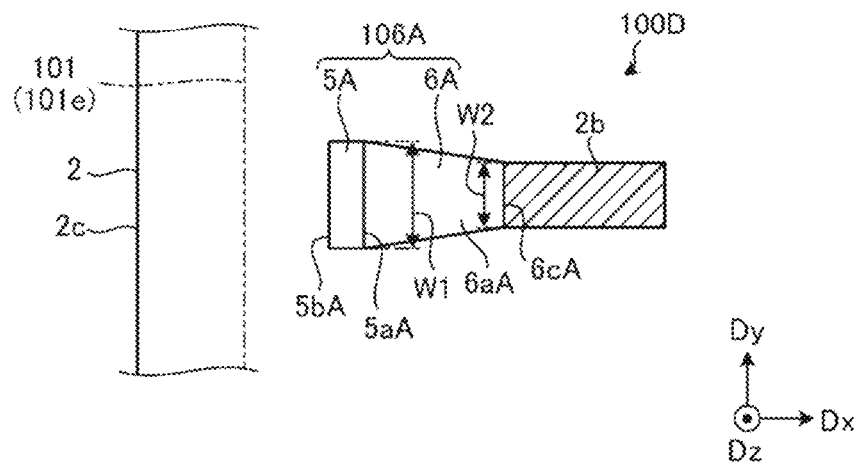
FIG. 11 is a plan view of a terminal according to the third modified example.

FIG. 10 is a perspective view of a terminal according to a third modified example. FIG. 11 is a plan view of a terminal according to the third modified example. In the third modified example, the configuration in which, unlike the first embodiment and the first and second modified examples, the width, in second direction Dy, of a mounting electrode 2b of the mother board 2 is smaller than the width, in second direction Dy, of a support portion 5A of a corresponding terminal 106A will be described.

As illustrated in FIG. 10, a connection portion 6A has a trapezoidal shape in a plan view. The connection portion 6A has a trapezoidal shape so that the width of the support portion 5A is congruent with the width of the mounting electrode 2b. That is, as illustrated in FIG. 11, in a plan view, the side surfaces of the connection portion 6A incline relative to first direction Dx. First width W1 of a connecting part, in which the connection portion 6A connects with a first surface 5aA of the support portion 5A as an integral unit, of the connection portion 6A is larger than second width W2 of an end surface 6cA that is present in the extending direction of the connection portion 6A. Second width W2 is in the same degree as the width of the mounting electrode 2b in second direction Dy.

Thus, in a module component 100D according to the third modified example, even when the width of each mounting electrode 2b of the mother board 2 is different from the width of the corresponding support portion 5A, the terminal 106A may be connected to the mounting electrode 2b excellently. Compared with the configuration in which the width, in second direction Dy, of each support portion 5A and that of the corresponding connection portion 6A is equal to the width of the corresponding mounting electrode 2b in second direction Dy, the module component 100D may make the width of each support portion 5A larger. Therefore, the module component 100D may suppress an increase of the impedance of the terminals 106A, and may obtain a high joint strength of the terminals 106A.

The configuration according to the third modified example may be combined with the configurations according to the first and second modified examples described above.

Fourth Modified Example

Figure 12:
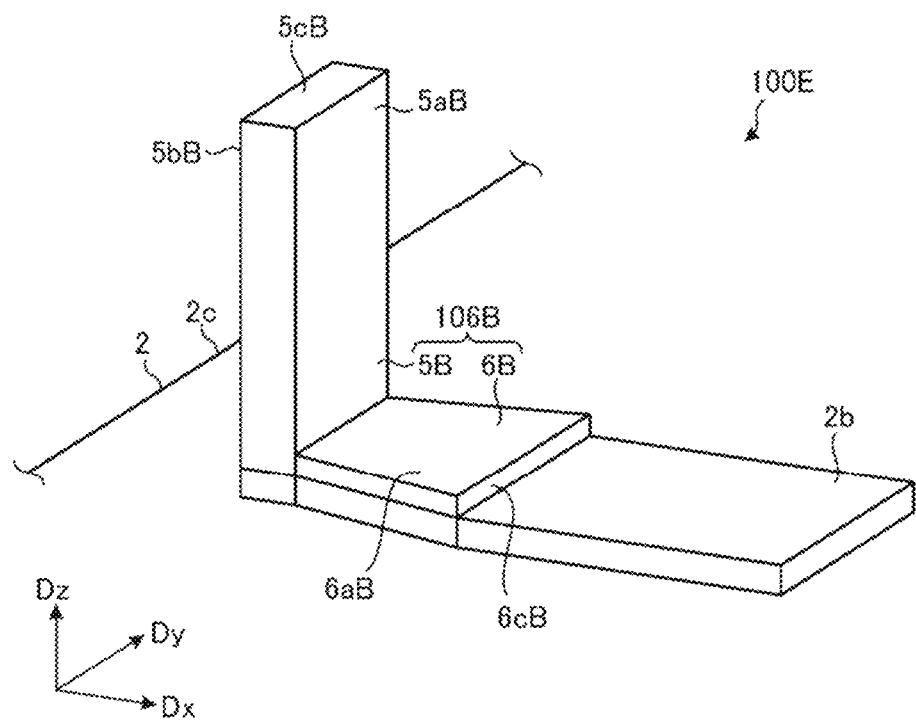
FIG. 12 is a perspective view of a terminal according to a fourth modified example.
Figure 13:
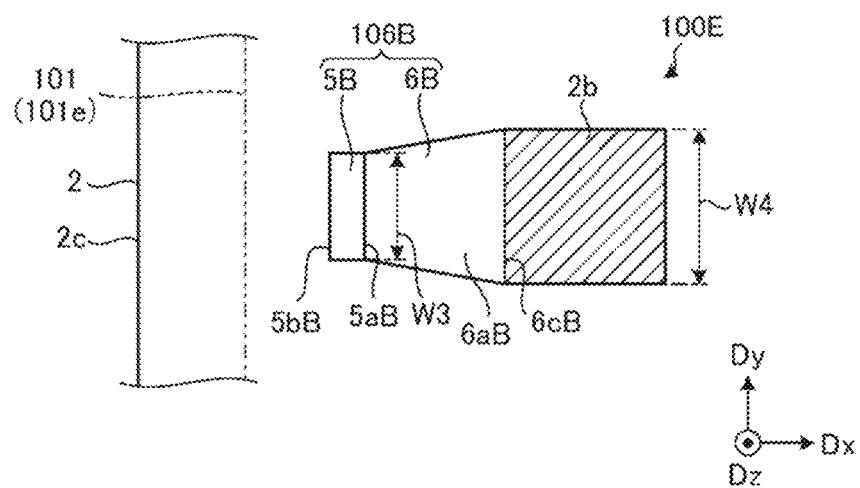
FIG. 13 is a plan view of a terminal according to the fourth modified example.

FIG. 12 is a perspective view of a terminal according to a fourth modified example. FIG. 13 is a plan view of a terminal according to the fourth modified example. In the fourth modified example, the configuration in which, unlike the first embodiment and the first to third modified examples, the width, in second direction Dy, of a mounting electrode 2b of the mother board 2 is larger than the width, in second direction Dy, of a support portion 5B of a corresponding terminal 106B will be described.

As illustrated in FIG. 12, a connection portion 6B has a trapezoidal shape in a plan view. The connection portion 6B has a trapezoidal shape so that the width of the support portion 5B is congruent with the width of the mounting electrode 2b. The connection portion 6B has a trapezoidal shape whose orientation is opposite to that in the third modified example described above. That is, as illustrated in FIG. 13, in a plan view, first width W3 of a connecting part, in which the connection portion 6B connects with a first surface 5aB of the support portion 5B as an integral unit, of the connection portion 6B is smaller than second width W4 of an end surface 6cB that is present in the extending direction of the connection portion 6B. Second width W4 is in the same degree as the width of the mounting electrode 2b in second direction Dy.

Thus, in a module component 100E according to the fourth modified example, even when the width of each mounting electrode 2b of the mother board 2 is different from the width of the corresponding support portion 5B, the terminal 106B may be connected to the mounting electrode 2b excellently. Compared with the configuration in which the width, in second direction Dy, of each support portion 5B and that of the corresponding connection portion 6B is equal to the width of the corresponding mounting electrode 2b in second direction Dy, the module component 100E may make the width of each support portion 5B smaller. Therefore, the module component 100E may suppress a decrease of the impedance of the terminals 106B, and may obtain a high joint strength of the terminals 106B.

The configuration according to the fourth modified example may be combined with the configurations according to the first and second modified examples described above. When the mounting electrodes 2b of the mother board 2 have different widths, two or more of the following types of terminal may be combined with each other: the terminal 106B in the fourth modified example; the terminal 106A in the third modified example; and the terminal 106 in the first embodiment.

Second Embodiment

Figure 14:
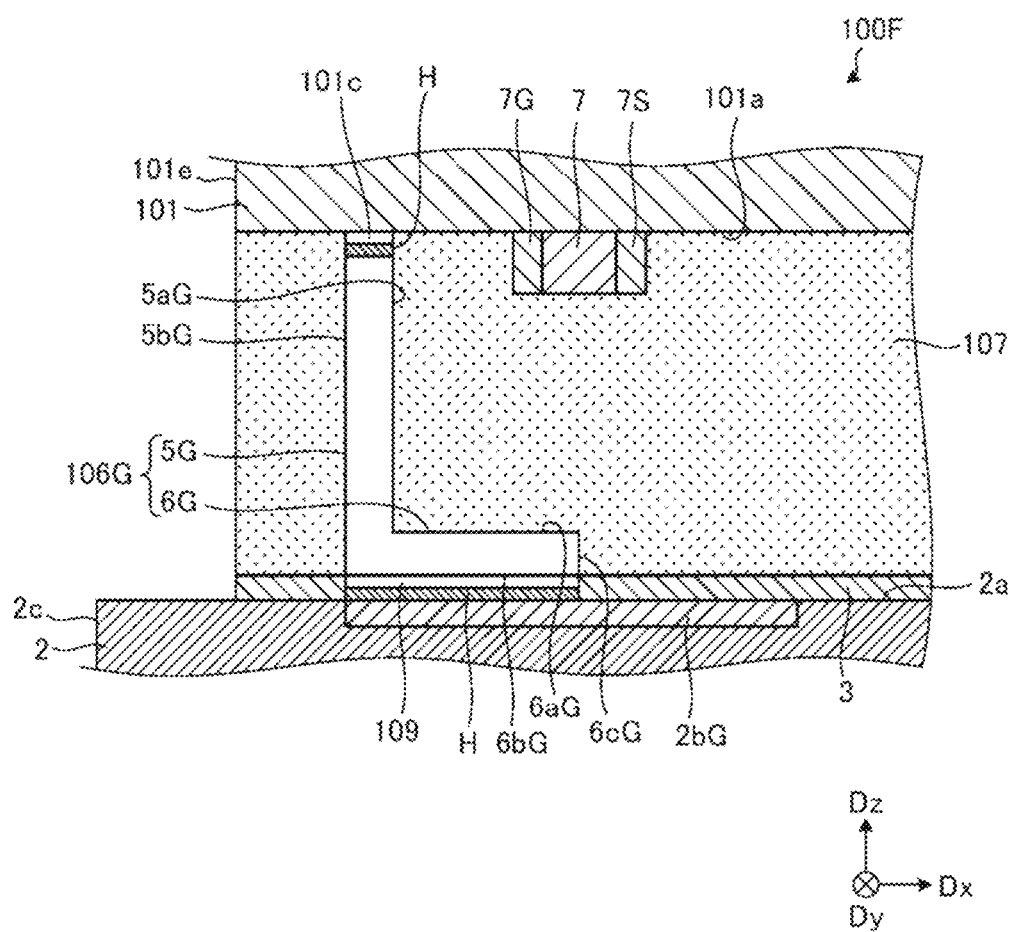
FIG. 14 is a cross-sectional view of a module component according to a second embodiment.

FIG. 14 is a cross-sectional view of a module component according to a second embodiment. In the second embodiment, the configuration in which, unlike the first embodiment and the first to fourth modified examples, a chip component 7 is mounted on the first principal surface 101a of the substrate 101 will be described.

The chip component 7 encompasses a chip capacitor, a chip inductor, a chip resistor, an IC, and the like. The chip component 7 includes a first terminal 7G, which is electrically connected to the reference potential, and a second terminal 7S, which is supplied with signals. At least a part of the chip component 7 is disposed between the substrate 101 and the connection portion 6G of a reference-potential terminal 106G in third direction Dz. The chip component 7 is disposed so that the first terminal 7G and the second terminal 7S are arrayed in first direction Dx. In first direction Dx, the first terminal 7G of the chip component 7 is disposed between the first surface 5aG of the support portion 5G of the reference-potential terminal 106G and the second terminal 7S of the chip component 7.

Thus, in a module component 100F according to the second embodiment, the chip component 7 is disposed closer to a reference-potential terminal 106G than a signal terminal 106S, and the first terminal 7G of the chip component 7 is disposed closer to the reference-potential terminal 106G than the second terminal 7S. This enables the first terminal 7G of the chip component 7 to be supplied with the reference potential without fail. In addition, a wiring pattern for connecting the reference-potential terminal 106G to the first terminal 7G of the chip component 7 may be made short.

Fifth Modified Example

Figure 15:
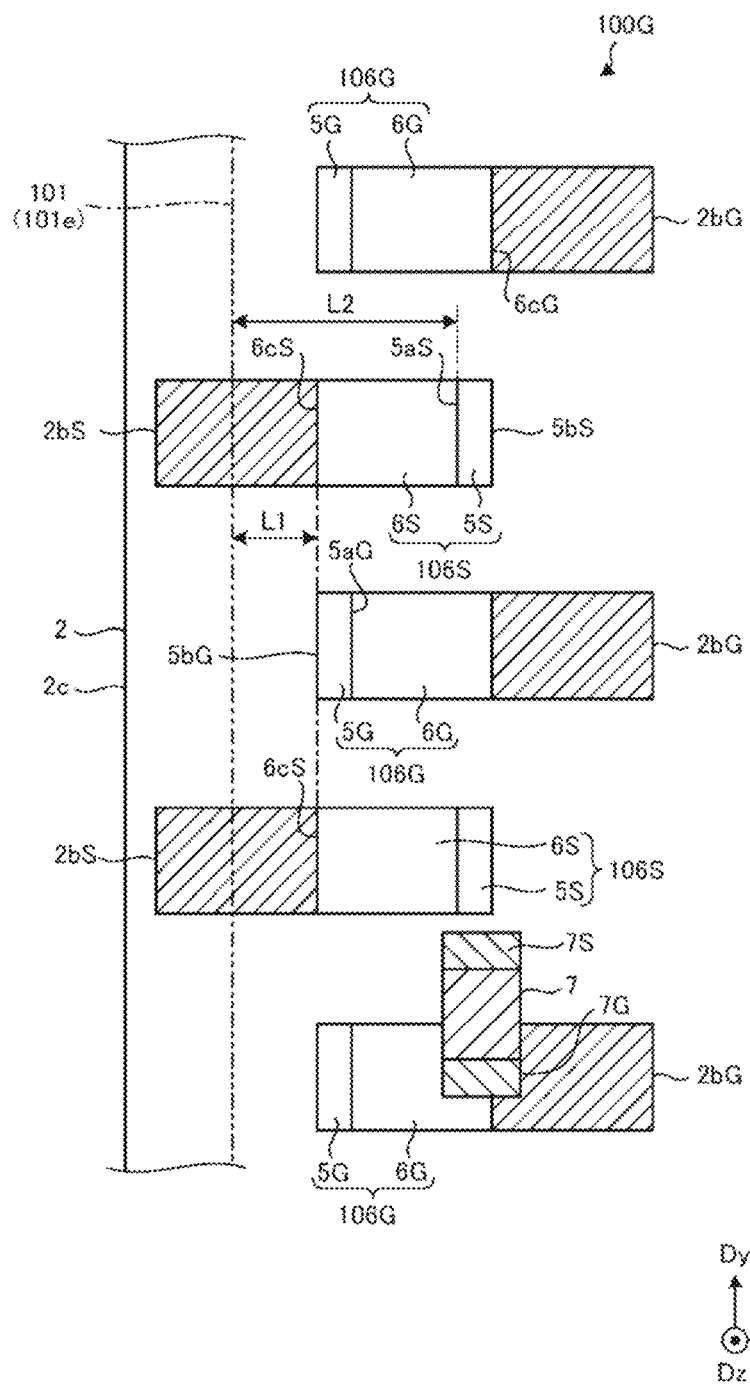
FIG. 15 is a plan view of a module component according to a fifth modified example.

FIG. 15 is a plan view of a module component according to a fifth modified example. In the fifth modified example, the configuration in which, unlike the second embodiment, the first terminal 7G and the second terminal 7S of the chip component 7 are arrayed in the second direction Dy will be described.

As illustrated in FIG. 15, in a plan view, the first terminal 7G of the chip component 7 is disposed so as to overlap the connection portion 6G of a reference-potential terminal 106G. The second terminal 7S of the chip component 7 is disposed adjacent to the support portion 5S of a signal terminal 106S in second direction Dy. That is, in second direction Dy, the second terminal 7S is disposed between the support portion 5S of the signal terminal 106S and the first terminal 7G.

Thus, in a module component 100G according to the fifth modified example, the first terminal 7G of the chip component 7 is disposed closer to a reference-potential terminal 106G than the second terminal 7S, and the second terminal 7S of the chip component 7 is disposed closer to a signal terminal 106S than the first terminal 7G. This enables a wiring pattern for connecting the signal terminal 106S to the second terminal 7S of the chip component 7 to be made short.

Sixth Modified Example

Figure 16:
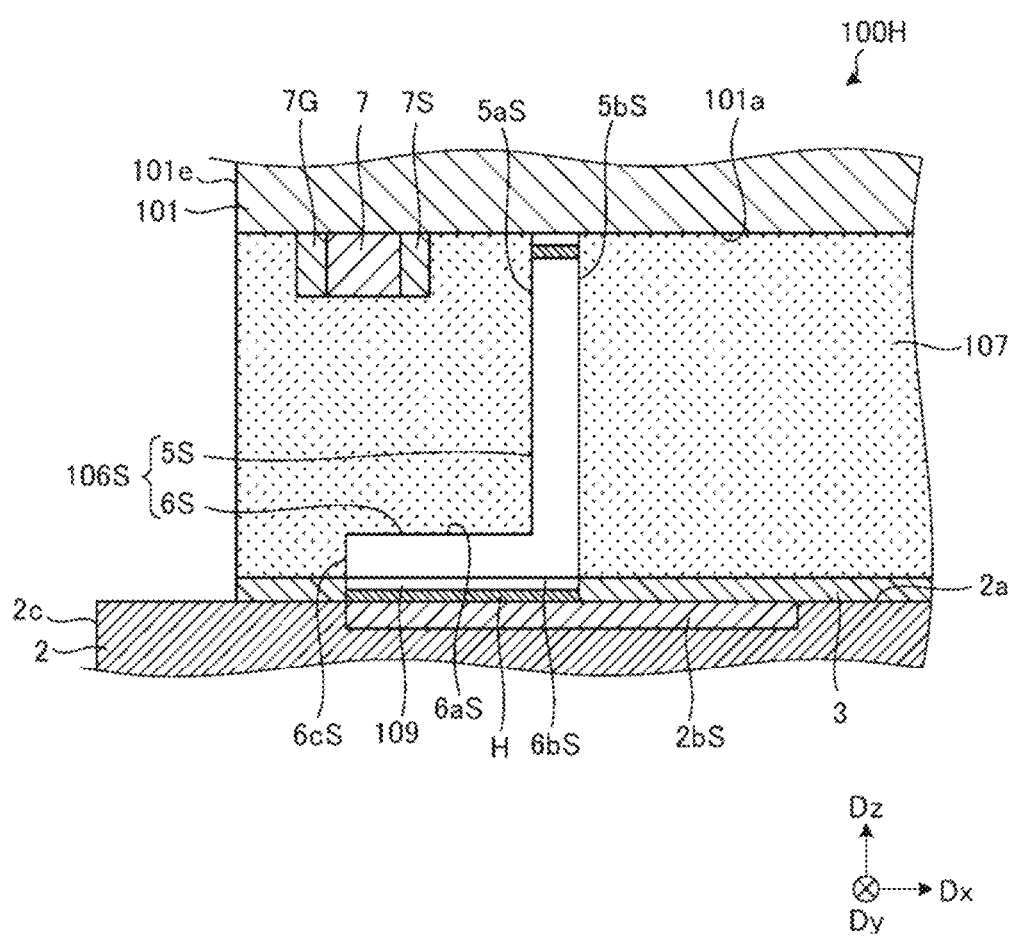
FIG. 16 is a cross-sectional view of a module component according to a sixth modified example.
Figure 17:
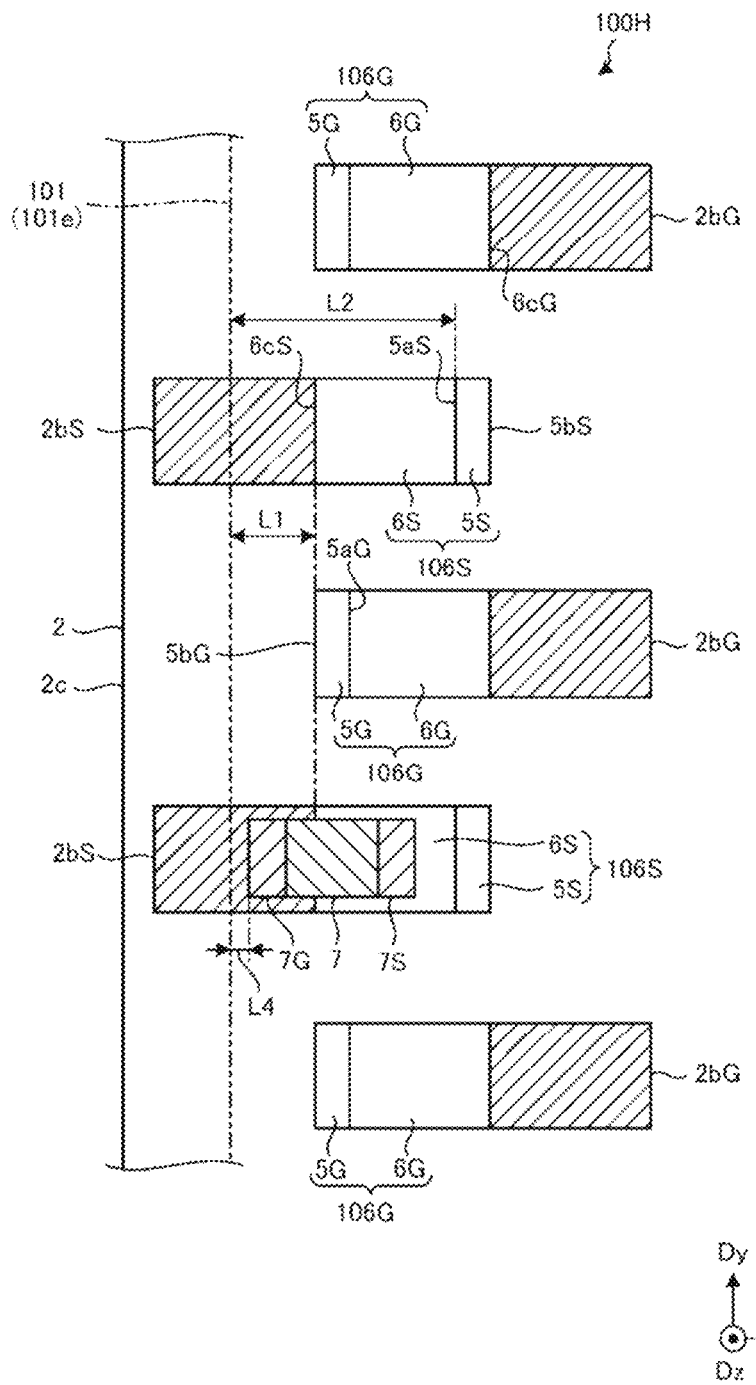
FIG. 17 is a plan view of a module component according to the sixth modified example.

FIG. 16 is a cross-sectional view of a module component according to a sixth modified example. FIG. 17 is a plan view of a module component according to the sixth modified example. In the sixth modified example, the configuration in which, unlike the second embodiment and the fifth modified example, the chip component 7 is disposed so as to overlap the connection portion 6S of a signal terminal 106S will be described.

As illustrated in FIG. 16, in third direction Dz, at least a part of the chip component 7 is disposed between the substrate 101 and the connection portion 6S of a signal terminal 106S. The chip component 7 is disposed between the end portion 101e of the substrate 101 and the support portion 5S of the signal terminal 106S in first direction Dx.

As illustrated in FIG. 17, the first terminal 7G of the chip component 7 is disposed closer to the end portion 101e of the substrate 101 than the second terminal 7S. Distance L4, in first direction Dx, between the first terminal 7G and the end portion 101e of the substrate 101 is shorter than distance L1 and distance L2. The second terminal 7S is disposed between the first surface 5aS of the support portion 5S of the signal terminal 106S and the first terminal 7G.

In the configuration described above, in a module component 100H according to the sixth modified example, the first terminal 7G of the chip component 7 is disposed adjacent to a reference-potential terminal 106G in second direction Dy, and the second terminal 7S of the chip component 7 is disposed adjacent to the signal terminal 106S in first direction Dx.

The configurations according to the second embodiment and the fifth and sixth modified examples may be combined with the configurations according to the first to fourth modified examples of the first embodiment described above.

Embodiment Example

Figure 18:
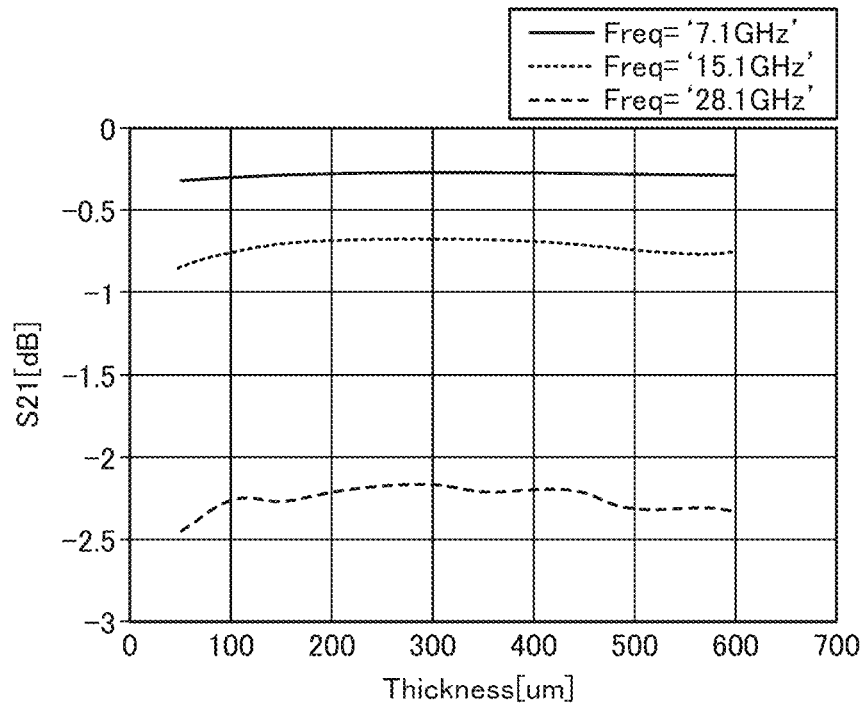
FIG. 18 is a graph illustrating the relationship between terminal plate thickness and S-parameter S21 according to an embodiment example.
Figure 19:
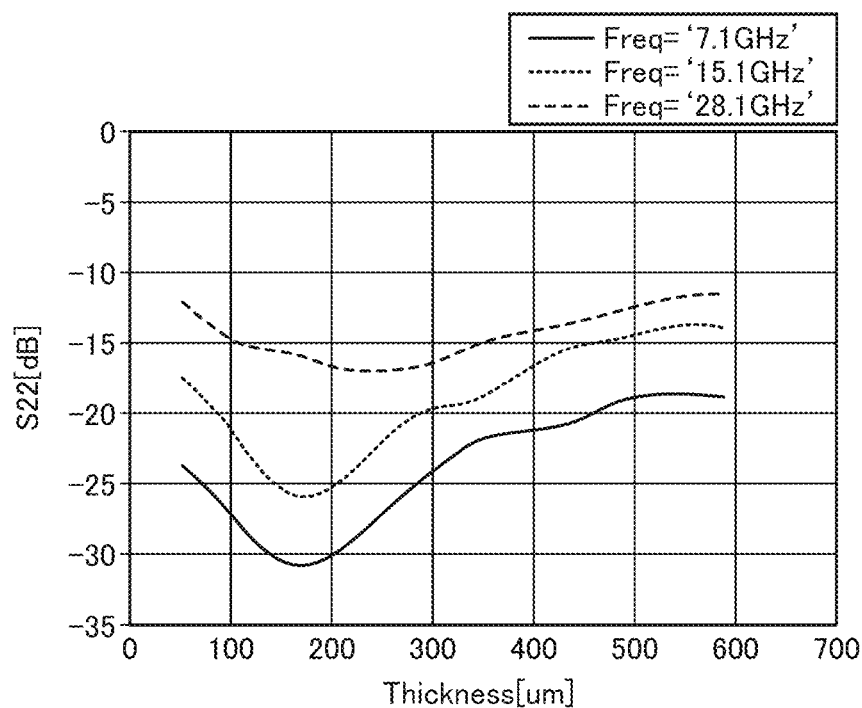
FIG. 19 is a graph illustrating the relationship between terminal plate thickness and S-parameter S22 according to an embodiment example.

FIG. 18 is a graph illustrating the relationship between terminal plate thickness and S-parameter S21 according to an embodiment example. FIG. 19 is a graph illustrating the relationship between terminal plate thickness and S-parameter S22 according to an embodiment example. FIGS. 18 and 19 illustrate simulation results of S-parameters S21 and S22 obtained when the frequency Freq of a signal propagating through a terminal 106 is changed to the following different frequencies: 7.1 GHz, 15.1 GHz, and 28.1 GHz. The vertical axis of the graph in FIG. 18 represents S-parameter S21 which indicates bandpass characteristics. The horizontal axis of the graph in FIG. 18 represents the plate thickness of a terminal 106, and, more specifically, represents the plate thickness of the support portion 5 and the plate thickness of the connection portion 6. The vertical axis of the graph in FIG. 19 represents S-parameter S22 which indicates reflection characteristics. The horizontal axis of the graph in FIG. 19 represents the plate thickness of a terminal 106.

As illustrated in FIG. 18, even when the plate thickness of the terminal 106 is made different, the changes of S-parameter S21 are small. As illustrated in FIG. 19, at the frequencies Freq of 7.1 GHz and 15.1 GHz, in the range of the plate thickness between 50 μm and 300 μm inclusive, return loss may be suppressed. At the frequency Freq of 28.1 GHz, in the range of the plate thickness between 100 μm and 350 μm inclusive, return loss may be suppressed.

Third Embodiment

Figure 20:
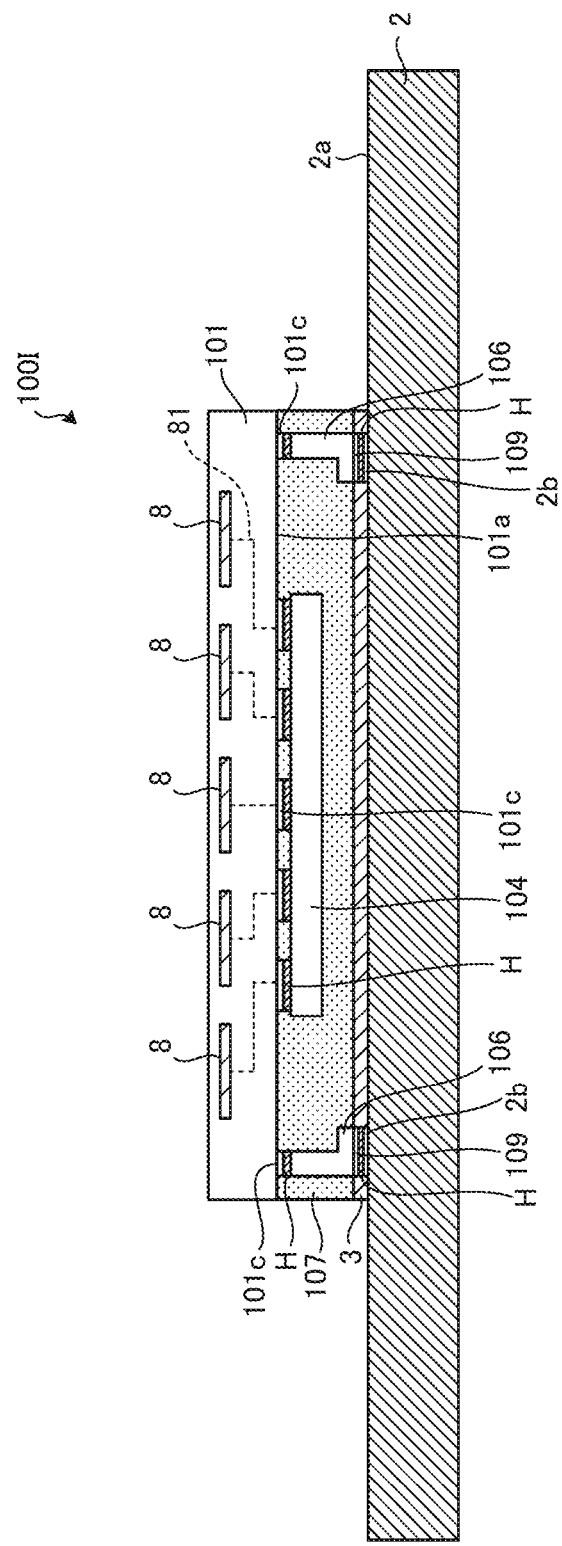
FIG. 20 is a cross-sectional view of an antenna module according to a third embodiment.

FIG. 20 is a cross-sectional view of an antenna module according to a third embodiment. In the third embodiment which is different from the second embodiment and the first to sixth modified examples, the configuration of an antenna module 100I including antenna devices 8 and an RFIC 110 will be described.

As illustrated in FIG. 20, in the antenna module 100I, the antenna devices 8 are included in the substrate 101. The substrate 101 including the antenna devices 8 functions, for example, as an antenna array. The semiconductor substrate 104 is configured as the RFIC (Radio Frequency Integrated Circuit) 110. That is, the RFIC 110 is disposed on the first principal surface 101a of the substrate 101. The antenna devices 8 are electrically connected to the semiconductor substrate 104 (RFIC 110) through transmission lines 81 disposed in the substrate 101. The terminals 106 are electrically connected to the semiconductor substrate 104 (RFIC 110) through a wiring pattern disposed on the substrate 101.

Figure 21:
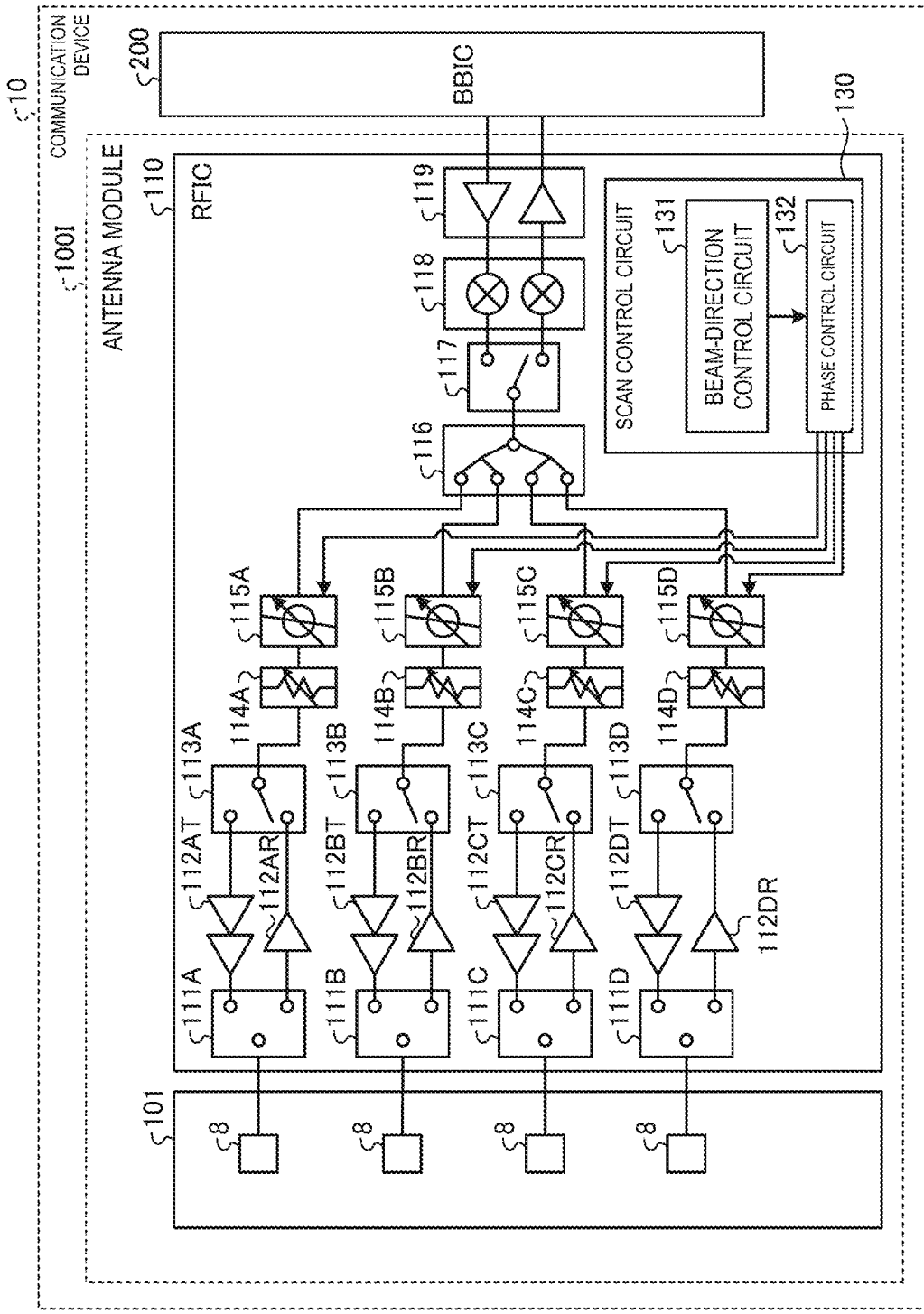
FIG. 21 is a block diagram illustrating the configuration of a communication device including an antenna module according to the third embodiment.

FIG. 21 is a block diagram illustrating the configuration of a communication device including an antenna module according to the third embodiment. A communication device 10 is, for example, a portable terminal, such as a cellular phone, a smartphone, or a tablet terminal, or a personal computer having a communication function. Alternatively, the communication device 10 may perform backhaul communication for communicating between base stations and communicating between base stations and a core network.

As illustrated in FIG. 21, the communication device 10 includes the antenna module 100I and a baseband IC 200 (hereinafter referred to as a BBIC (Baseband Integrated Circuit)). The antenna module 100I includes the RFIC 110, which is an exemplary power supply circuit, and the substrate 101 (antenna array). The BBIC 200 forms a baseband signal processing circuit. The BBIC 200 supplies the antenna module 100I with baseband signals.

The communication device 10 upconverts signals, which are transmitted from the BBIC 200 to the antenna module 100I, into radio frequency signals, and radiates the radio frequency signals from the antenna devices 8. The communication device 10 down-converts radio frequency signals, which are received at the antenna devices 8, and processes the signals in the BBIC 200.

To make the description easier, FIG. 21 illustrates only the configuration corresponding to four of the antenna devices 8. The configuration corresponding to the other antenna devices 8, which is substantially the same, will not be illustrated. In the present embodiment, the case in which each antenna device 8 is a patch antenna having a rectangular planar shape will be described as an example.

The RFIC 110 includes switches 111A, 111B, 111C, 111D, 113A, 113B, 113C, 113D, and 117, power amplifiers 112AT, 112BT, 112CT, and 112DT, low noise amplifiers 112AR, 112BR, 112CR, and 112DR, attenuators 114A, 114B, 114C, and 114D, digital phase shifters 115A, 115B, 115C, and 115D, a signal combining/branching device 116, a mixer 118, and an amplifying circuit 119.

In transmission of radio frequency signals, the switches 111A, 111B, 111C, 111D, 113A, 113B, 113C, and 113D are switched to the power amplifiers 112AT, 112BT, 112CT, and 112DT. The switch 117 is connected to the transmission amplifier of the amplifying circuit 119.

A signal transmitted from the BBIC 200 is amplified by the amplifying circuit 119, and is upconverted by the mixer 118. The transmit signal, which is the radio frequency signal having been upconverted, is branched, by the signal combining/branching device 116, into four signals which pass through four signal paths and which are supplied to the corresponding different antenna devices 8. At that time, the phase values of the digital phase shifters 115A, 115B, 115C, and 115D, which are disposed in the respective signal paths, are adjusted individually, enabling adjustment of the directivity of the antenna array.

In reception of radio frequency signals, the switches 111A, 111B, 111C, 111D, 113A, 113B, 113C, and 113D are switched to the low noise amplifiers 112AR, 112BR, 112CR, and 112DR. The switch 117 is connected to the reception amplifier of the amplifying circuit 119.

Receive signals, which are radio frequency signals received by the respective antenna devices 8, pass through the corresponding different four signal paths, and are combined into a signal by the signal combining/branching device 116. The combined receive signal is down-converted by the mixer 118, and is amplified by the amplifying circuit 119 for transmission to the BBIC 200.

The RFIC 110 further includes a scan control circuit 130. The scan control circuit 130 is a circuit which controls the beam direction in transmission and the beam direction in reception. The scan control circuit 130 includes a beam-direction control circuit 131 and a phase control circuit 132. The beam-direction control circuit 131 outputs a control signal, which is based on the beam direction in transmission or the beam direction in reception, to the phase control circuit 132. The phase control circuit 132 calculates the phases of signals, propagating through the respective antenna devices 8, on the basis of the control signal from the beam-direction control circuit 131. Then, the phase control circuit 132 outputs phase command values to the digital phase shifters 115A, 115B, 115C, and 115D.

On the basis of the phase command values, the digital phase shifters 115A, 115B, 115C, and 115D discretely change the phases of signals propagating through the respective antenna devices 8.

The RFIC 110 is formed, for example, as a single-chip integrated circuit component including the circuit configuration described above. Alternatively, for each antenna device 8, the devices (the switch, the power amplifier, the low noise amplifier, the attenuator, and the digital phase shifter) corresponding to the antenna device 8 in the RFIC 110 may be formed as a single-chip integrated circuit component. The configuration in which the scan control circuit 130 is included in the RFIC 110 is not limiting. For example, the scan control circuit 130 is not necessarily included in the RFIC 110, and may be included in the communication device 10.

The configuration according to the third embodiment may be combined with the configurations according to the first and second embodiments and the modified examples described above.

The embodiments described above are made to facilitate understanding of the present disclosure, not for limited interpretation of the present disclosure. The present disclosure may be changed/improved without departing from the gist of the present disclosure. The present disclosure encompasses its equivalents.

REFERENCE SIGNS LIST 1 module mounted device
2 mother board 2a mounting surface
2b mounting electrode
2bG reference-potential electrode
2bS signal electrode
2c end portion
3 underfill resin layer
5 support portion
5a first surface
5b second surface
6 connection portion
6a upper surface
6b lower surface
6c end surface
7 chip component
8 antenna device
10 communication device
100, 100A, 100B, 100C, 100D, 100E, 100F, 100G, 100H module component
100I antenna module
101 substrate
101e end portion
104 semiconductor substrate
105 chip component
106 terminal
106G reference-potential terminal
106S signal terminal
109 metal film
110 RFIC
200 BBIC

The invention claimed is:

1. A module component comprising:
a substrate that has a first principal surface;
a semiconductor substrate that is disposed on the first principal surface of the substrate;
a plurality of terminals; and
a resin layer, wherein
each of the plurality of terminals includes
a support portion that has a first surface and a second surface, the first surface extending in a direction perpendicular to the first principal surface, the second surface being opposite the first surface, the support portion being connected to the first principal surface on a first end of the support portion, and
a connection portion that is disposed as an integral unit with the first surface on a second end of the support portion, and that extends in a direction perpendicular to the first surface,
the resin layer covers at least a side surface of the semiconductor substrate, and covers the support portion and an end surface of the connection portion, the end surface being present in an extending direction of the connection portion,
the plurality of terminals include
a plurality of reference-potential terminals that are connected to a reference potential electrically, and
a plurality of signal terminals that are disposed adjacent to at least one of the plurality of reference-potential terminals in a direction along an end portion of the substrate, and that are supplied with a signal,
in a plan view in the direction perpendicular to the first principal surface of the substrate, in at least one of the plurality of reference-potential terminals, the support portion is disposed between the end surface of the connection portion and the end portion of the substrate, and in the plan view, in at least one of the plurality of signal terminals, the end surface of the connection portion is disposed between the support portion and the end portion of the substrate.

2. The module component of claim 1, wherein
in the direction along the end portion of the substrate, the plurality of reference-potential terminals are alternately disposed one by one with the plurality of signal terminals.

3. The module component of claim 1, wherein
in the direction along the end portion of the substrate, the plurality of signal terminals are disposed side by side between two of the plurality of reference-potential terminals.

4. The module component of claim 1, wherein
in the plan view in the direction perpendicular to the first principal surface of the substrate, a first distance between the support portion of at least one of the plurality of reference-potential terminals and the end portion of the substrate is shorter than a second distance between the support portion of at least one of the plurality of signal terminals and the end portion of substrate.

5. The module component of claim 4, wherein
the first distance is equal to a third distance between the end portion of the substrate and the end surface of the connection portion of at least one of the plurality of signal terminals, the end surface being present in the extending direction of the connection portion.

6. The module component of claim 4, wherein
a third distance between the end portion of the substrate and the end surface of the connection portion of at least one of the plurality of reference-potential terminals, the end surface being present in the extending direction of the connection portion, is shorter than the second distance between the support portion of at least one of the plurality of signal terminals and the end portion of the substrate.

7. The module component of claim 1, further comprising:
a component that is mounted on the first principal surface of the substrate and that includes a first terminal and a second terminal, the first terminal being electrically connected to the reference potential, the second terminal being supplied with a signal.

8. The module component of claim 7, wherein
in the direction perpendicular to the first principal surface of the substrate, at least a part of the component is disposed between the substrate and the connection portion of at least one of the plurality of reference-potential terminals.

9. The module component of claim 8, wherein
in a direction parallel to the first principal surface of the substrate, the first terminal is disposed between the support portion of the at least one of the plurality of reference-potential terminals and the second terminal.

10. The module component of claim 7, wherein
in the direction perpendicular to the first principal surface of the substrate, the first terminal is disposed so as to overlap the connection portion of at least one of the plurality of reference-potential terminals.

11. The module component of claim 10, wherein
in a direction parallel to the first principal surface of the substrate, the first terminal and the second terminal are disposed side by side in a direction along the first surface of the at least one of the plurality of reference-potential terminals.

12. The module component of claim 11, wherein
the second terminal is disposed between the support portion of at least one of the plurality of signal terminals and the first terminal.

13. The module component of claim 7, wherein
in the direction perpendicular to the first principal surface of the substrate, at least a part of the component is disposed between the substrate and the connection portion of at least one of the plurality of signal terminals.

14. The module component of claim 13, wherein
in a direction parallel to the first principal surface of the substrate, the first terminal is disposed closer to the end portion of the substrate than the second terminal.

15. The module component of claim 1, wherein
in the plan view in the direction perpendicular to the first principal surface of the substrate, a first width of a part of the connection portion, the part being a part in which the connection portion connects with the first surface, is larger than a second width of the end surface of the connection portion.

16. The module component of claim 15, wherein
the end surface is present in the extending direction of the connection portion.

17. The module component of claim 1, wherein
in the plan view in the direction perpendicular to the first principal surface of the substrate, a first width of a part of the connection portion, the part being a part in which the connection portion connects with the first surface, is smaller than a second width of the end surface of the connection portion.

18. The module component of claim 17, wherein
the end surface is present in the extending direction of the connection portion.

19. An antenna module comprising:
a module component including
    a substrate that has a first principal surface;
    a semiconductor substrate that is disposed on the first principal surface of the substrate;
    a plurality of terminals; and
    a resin layer, wherein
    each of the plurality of terminals includes
        a support portion that has a first surface and a second surface, the first surface extending in a direction perpendicular to the first principal surface, the second surface being opposite the first surface, the support portion being connected to the first principal surface on a first end of the support portion, and
        a connection portion that is disposed as an integral unit with the first surface on a second end of the support portion, and that extends in a direction perpendicular to the first surface,
    the resin layer covers at least a side surface of the semiconductor substrate, and covers the support portion and an end surface of the connection portion, the end surface being present in an extending direction of the connection portion,
    the plurality of terminals include
        a plurality of reference-potential terminals that are connected to a reference potential electrically, and
        a plurality of signal terminals that are disposed adjacent to at least one of the plurality of reference-potential terminals in a direction along an end portion of the substrate, and that are supplied with a signal,
    in a plan view in the direction perpendicular to the first principal surface of the substrate, in at least one of the plurality of reference-potential terminals, the support portion is disposed between the end surface of the connection portion and the end portion of the substrate, and
    in the plan view, in at least one of the plurality of signal terminals, the end surface of the connection portion is disposed between the support portion and the end portion of the substrate;
a plurality of antenna devices that are disposed in the substrate; and
a radio frequency integrated circuit that is disposed on the first principal surface of the substrate.

20. A communication device comprising:
an antenna module including
    a module component including
        a substrate that has a first principal surface;
        a semiconductor substrate that is disposed on the first principal surface of the substrate;
        a plurality of terminals; and
        a resin layer, wherein
        each of the plurality of terminals includes
            a support portion that has a first surface and a second surface, the first surface extending in a direction perpendicular to the first principal surface, the second surface being opposite the first surface, the support portion being connected to the first principal surface on a first end of the support portion, and
            a connection portion that is disposed as an integral unit with the first surface on a second end of the support portion, and that extends in a direction perpendicular to the first surface,
        the resin layer covers at least a side surface of the semiconductor substrate, and covers the support portion and an end surface of the connection portion, the end surface being present in an extending direction of the connection portion,
        the plurality of terminals include
            a plurality of reference-potential terminals that are connected to a reference potential electrically, and
            a plurality of signal terminals that are disposed adjacent to at least one of the plurality of reference-potential terminals in a direction along an end portion of the substrate, and that are supplied with a signal,
        in a plan view in the direction perpendicular to the first principal surface of the substrate, in at least one of the plurality of reference-potential terminals, the support portion is disposed between the end surface of the connection portion and the end portion of the substrate, and
        in the plan view, in at least one of the plurality of signal terminals, the end surface of the connection portion is disposed between the support portion and the end portion of the substrate;
    a plurality of antenna devices that are disposed in the substrate; and
    a radio frequency integrated circuit that is disposed on the first principal surface of the substrate; and
a baseband integrated circuit that supplies a baseband signal to the antenna module.

* * * * *